(12) United States Patent
Moore et al.

(10) Patent No.: US 10,715,754 B2
(45) Date of Patent: Jul. 14, 2020

(54) SINGLE REFERENCE CLOCK TIME TO DIGITAL CONVERTER

(71) Applicant: STMicroelectronics (Research & Development) Limited, Buckinghamshire (GB)

(72) Inventors: John Kevin Moore, Edinburgh (GB); Neale Dutton, Edinburgh (GB)

(73) Assignee: STMicroelectronics (Research & Development) Limited, Buckinghamshire (GB)

(*) Notice: Subject to any disclaimer, the term of this patent is extended or adjusted under 35 U.S.C. 154(b) by 191 days.

(21) Appl. No.: 15/877,551

(22) Filed: Jan. 23, 2018

(65) Prior Publication Data

US 2019/0230304 A1 Jul. 25, 2019

(51) Int. Cl.
| | |
|---|---|
| H04N 5/376 | (2011.01) |
| H04N 5/3745 | (2011.01) |
| H04N 5/378 | (2011.01) |
| H03M 1/12 | (2006.01) |
| H03L 7/08 | (2006.01) |
| G04F 10/00 | (2006.01) |

(52) U.S. Cl.
CPC ......... *H04N 5/3765* (2013.01); *G04F 10/005* (2013.01); *H03M 1/1245* (2013.01); *H04N 5/378* (2013.01); *H04N 5/37455* (2013.01); *H03L 7/08* (2013.01)

(58) Field of Classification Search
CPC ..... H04N 5/3745–37455; H04N 5/378; H04N 5/3355; H03M 1/00–645
USPC ......................................... 341/155–172, 120
See application file for complete search history.

(56) References Cited

U.S. PATENT DOCUMENTS

| | | | |
|---|---|---|---|
| 9,639,063 B2 | 5/2017 | Dutton et al. | |
| 2008/0129574 A1* | 6/2008 | Choi ..................... | G04F 10/005 341/166 |
| 2010/0328130 A1* | 12/2010 | Bulzacchelli ........... | H03M 1/20 341/166 |
| 2017/0115381 A1 | 4/2017 | Moore et al. | |

* cited by examiner

*Primary Examiner* — Xi Wang
(74) *Attorney, Agent, or Firm* — Slater Matsil, LLP

(57) ABSTRACT

In an embodiment, a TDC includes: a clock input configured to receive a reference clock that is synchronized with a first event; a clock generation circuit configured to generate a first clock at a first output of the clock generation circuit based on the reference clock, the first clock having a second frequency lower than the reference clock; a data input configured to receive an input stream of pulses, where the input stream of pulses is based on the first event; a sampling circuit having an input register, the sampling circuit coupled to the data input, the sampling circuit configured to continuously sample the input stream of pulses into the input register based on the reference clock; and output terminals configured to stream time stamps based on the input stream of pulses at the second frequency, where the stream of time stamps is synchronized with the first clock.

35 Claims, 12 Drawing Sheets

SINGLE REFERENCE CLOCK TIME TO DIGITAL CONVERTER

TECHNICAL FIELD

The present invention relates generally to an electronic system and method, and, in particular embodiments, to a single reference clock time to digital converter (TDC).

BACKGROUND

A time to digital converters (TDC) is a device that provides a digital representation of a time associated with events. For example, a TDC may be used to measure a time between a first event and a second event.

An implementation of a TDC may use a counter. The counter is started when the first event occurs and it is stopped when the second event occurs. The resulting count of the counter is a representation of the time between the first event and the second event. The time may be calculated by using the resulting count and the frequency of the clock received by the counter. In this type of TDC implementation, a higher clock frequency typically results in higher time resolution.

A TDC may be used, for example, in ranging systems that use time of flight (ToF) techniques to determine distance. For example, in ToF systems, a pulse of light is emitted and reflected off an object back to a photonic sensor, such as a single photon avalanche diode (SPAD). The time taken for the light to travel to the object and be reflected back onto the single photonic sensor may be used to determine the distance between the object and the device based on the known speed of light. A TDC may be used to generate a digital representation of the time between the transmitting of the pulse of light and the receiving of the light by the photonic sensor.

SUMMARY

In an embodiment, a TDC includes a clock input configured to receive a reference clock that is synchronized with a first event and a clock generation circuit configured to generate a first clock at a first output of the clock generation circuit based on the reference clock. The first clock has a second frequency lower than the reference clock. The TDC further includes a data input configured to receive an input stream of pulses, where the input stream of pulses is based on the first event and a sampling circuit having an input register. The sampling circuit is coupled to the data input and is configured to continuously sample the input stream of pulses into the input register based on the reference clock. The TDC also includes output terminals configured to stream time stamps based on the input stream of pulses at the second frequency, where the stream of time stamps is synchronized with the first clock.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
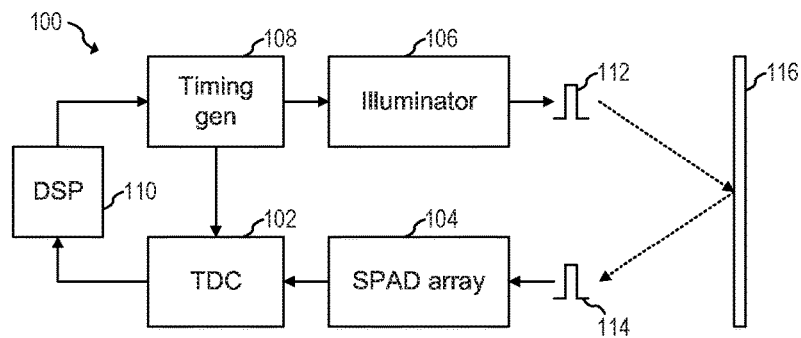
FIG. 1A shows an exemplary ToF imaging system.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to preferred embodiments in a specific context, an imaging system having a SPAD array with a plurality of TDCs that use a single reference clock. Embodiments of the present invention may be used in other systems, such as other ToF applications including proximity sensors, light detection and ranging (LIDAR), also called LADAR, depth profiling, autofocus for cameras, and others. Embodiments may also be used in applications that measure time between events and/or utilize time stamps of events. Some of the SPAD array embodiments disclosed may use TDC architectures that are different from the TDC embodiments disclosed herein. Similarly, the embodiments of the TDCs disclosed herein may be used in other applications that may benefit from time measurements.

In an embodiment of the present invention, TDCs that use a reference clock that is synchronized with a circuit that launches laser pulses are used to determine ToF measurements locally (inside the SPAD array). The TDCs, which are disposed inside the SPAD array, generate parallel digital outputs at low frequencies that are transmitted via transmission channels to a logic circuit disposed outside the SPAD array for further processing. The switching rates of the outputs of the TDCs are further reduced by using edge detectors with a toggle function. By reducing the switching rates, power consumption is reduced.

By disposing the TDCs inside the SPAD array, the distance between the SPADs and the TDCs is reduced. The capacitances associated with the transmission channels between the SPADs and the TDCs, therefore, are also reduced. By reducing the capacitances, the absolute delay from path to path is reduced: with this reduction in absolute delay, variations in delay due to device mismatch or temperature effects are also reduced. With this, the total mismatch, which could shift the ToF measurements, may also be reduced. Reducing the capacitances may also reduce power consumption. Power consumption may be further reduced by reducing the switching frequency and the switching rate of the outputs of the TDCs.

FIG. 1A shows exemplary ToF imaging system 100. ToF imaging system 100 includes illumination source 106, SPAD array 104, TDC 102, timing generator circuit 108, and digital signal processor (DSP) 110. During normal operation, illumination source 106 emits radiation pulse 112 at a time controlled by timing generator circuit 108. Radiation pulse 114 is reflected back from object 116 and is sensed by SPAD array 104. TDC 102 generates a digital representation of the time between the emission of radiation pulse 112 and reception of radiation pulse 114. TDC 102 may determine the time of emission of radiation pulse 112 based on a pulse received by timing generation circuit 109. TDC 102 may determine the time of reception of radiation pulse 114 based on SPADs of SPAD array 104 being stimulated. DSP 110 may process the information data received by TDC 102 to determine the distance to object 116.

To increase accuracy in the ToF measurements, illumination source 106 may emit multiple radiation pulses 112 and SPAD array 104 may receive multiple radiation pulses 114. DSP 110 may create a histogram of the multiple ToF measurements, and determine the distance to the object based on the histogram rather than based on a single ToF measurement.

As will be shown below, TDC 102 may be implemented according to embodiments of the present intention.

Figure 1B:
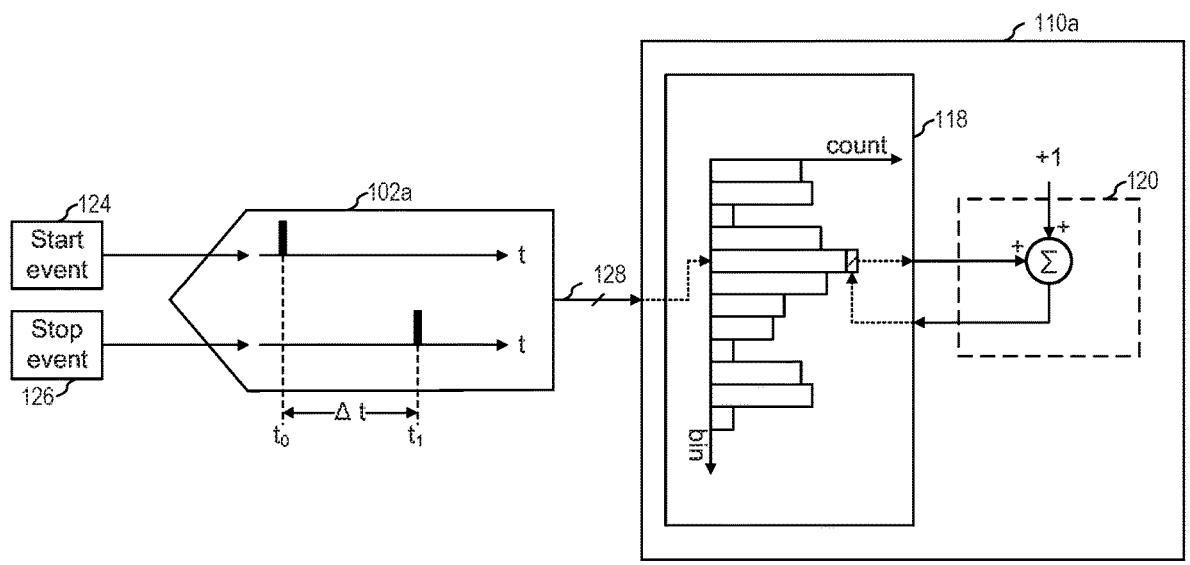
FIG. 1B shows a diagram illustrating an exemplary process of histogram creation based on ToF measurements of the ToF imaging system of FIG. 1A.

FIG. 1B shows a diagram illustrating an exemplary process of histogram creation based on ToF measurements of ToF imaging system 100. During normal operation, illumination source 106 emits multiple radiation pulses 112 and SPAD array 104 receives multiple radiation pulses 114. Each time a radiation pulse is emitted, TDC 102$a$ sends to DSP 110$a$ digital code 128 based on time $\Delta t$ between time $t_0$ of the emission time of radiation pulse 112 and time $t_1$ of the reception time of the next radiation pulse 114. DSP 110$a$ receives digital code 128 and updates histogram 118 by using accumulator 120 and incrementing by +1 the bin in the histogram associated with code 128.

Figure 1C:
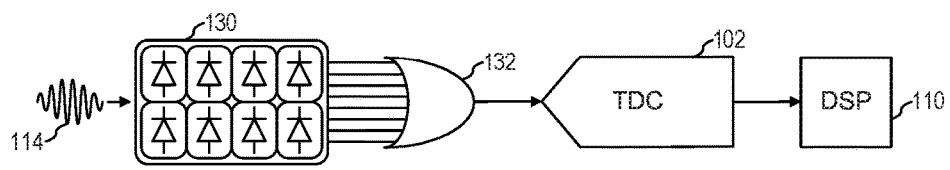
FIG. 1C shows an exemplary implementation of an OR tree in the ToF imaging system of FIG. 1A.

Some imaging systems may be implemented with one TDC per SPAD in the SPAD array. In other words, an imaging system having a SPAD array of 16 SPADs may be implemented with 16 TDCs, where the DSP generates a histogram per TDC and/or a single histogram for all the TDCs. However, some systems may reduce the number of TDCs by using an OR tree. FIG. 1C shows an exemplary implementation of OR tree 132 in ToF imaging system 100. As shown in FIG. 1C, SPAD cluster 130 includes 8 SPADs, where each of the 8 SPADs is connected to OR tree 132. During normal operation, radiation pulse 114 stimulates one or more of the SPADs of SPAD cluster 130. Each time one or more SPADs of SPAD cluster 130 is stimulated, the output of OR tree 132 is asserted. TDC 102 interprets each time radiation pulse 112 is emitted as start event 124 and each time the output of OR tree 132 is asserted as stop event 126.

TDCs' typically operate with a clock frequency similar to that of the imaging system. Even though it is possible to generate fast clock frequencies in a particular imaging system (e.g., 1 GHz, 2 GHz, 4 GHz, or others), the maximum operating frequency of the imaging system is often limited by factors such as power consumption, timing constraints limitations and process limitations, among others. Some imaging systems, therefore, use TDCs having a time resolution greater than one TDC clock cycle. A possible implementation uses multiple clocks running at the operating frequency of the imaging system, where each of the multiple clocks is a delayed replica (i.e., different phase) of a phased locked loop (PLL) clock. Possible implementations of such TDCs are described in U.S. Pat. No. 9,639,063 and U.S. patent application Ser. No. 14/920,344, which are hereby incorporated herein by reference.

Figure 1D:
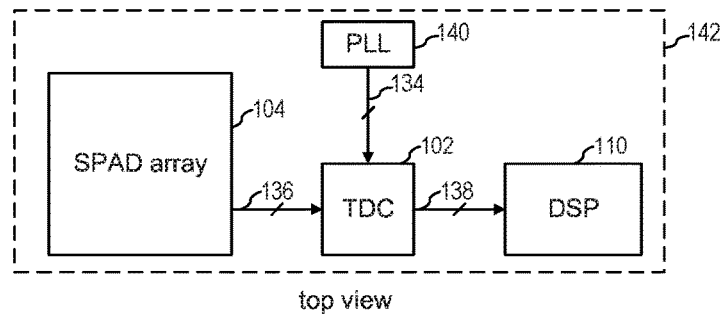
FIG. 1D shows a diagram illustrating a top view of an exemplary layout of portions of the ToF imaging system of FIG. 1A (not to scale) as well as some of the electrical connections.

FIG. 1D shows a diagram illustrating a top view of an exemplary layout of portions of ToF imaging system 100 (not to scale), as well as some of the electrical connections. As shown in FIG. 1D, SPAD array 104, TDC 102, PLL 140 and DSP no are disposed over substrate 142 of an integrated circuit. The SPADs of SPAD array 104 are grouped together, and the outputs of the SPADs of SPAD array 104 are routed using balanced routing channels 136 to TDC 102. TDC 102 may include one or more TDCs grouped together. PLL 140 generates multi-phase clock references that are routed to TDC 102 using routing channels 134. PLL 140 is disposed very close to TDC 102 to improve balancing and minimize discrepancies between clock phases, which can result in errors of the ToF measurements. TDC 102 generates ToF measurements that are transmitted to DSP no using routing channels 138. Additional details of implementations using a PLL that generates multi-phase clock references may be found in U.S. Pat. No. 9,639,063. As explained later, some embodiments use a single reference clock instead of a multi-phase PLL.

In general, it is desirable to minimize the length of the routing of routing channels 134 and 136 for a variety of reasons. For example, a routing channel has an associated capacitance that increases with the length of the routing. Switching a signal, such as digital data or digital clock over a routing channel charges and discharges the associated capacitance. The higher the capacitance, the higher the power dissipated by switching the signal. When the associated capacitance of the routing channel is high, minimizing power consumption may be achieved by reducing the switching rate of the signal.

The capacitance of the routing channel also affects the rise time and fall time of the signal as well as the delay of the signal. Maintaining particular phase relationships between signals of different routing channels, therefore, is easier when the associated capacitances of the routing channels are small.

As the size of SPAD array 104 increases, the power consumption associated with the switching of routing channels 136 also increases. Balancing routing channels 136 increases in complexity as the size of SPAD array 104 increases. Therefore, differences in time delays between different SPADs located in different portions of the array may develop and may result in inaccurate ToF measurements. Since TDC 102 typically also increases in size when SPAD array 104 increases in size (since it typically will contain more TDCs), balancing routing channels 134 also increases in complexity as the size of SPAD array 104 increases. Differences between phases of the references clocks generated by PLL 140 may develop and may result in inaccurate ToF measurements.

In an embodiment of the present invention, a SPAD array is arranged in rows and columns of macro pixels. Each macro pixel has a plurality of SPADs and a TDC coupled to the respective plurality of SPADs. Each TDC receives a single reference clock that is synchronized with the emission of a laser pulse and generates a plurality of parallel digital outputs that are coupled to a histogram generation logic circuit. In some embodiments, the single reference clock is gated when the TDC is not being used.

Figure 2A:
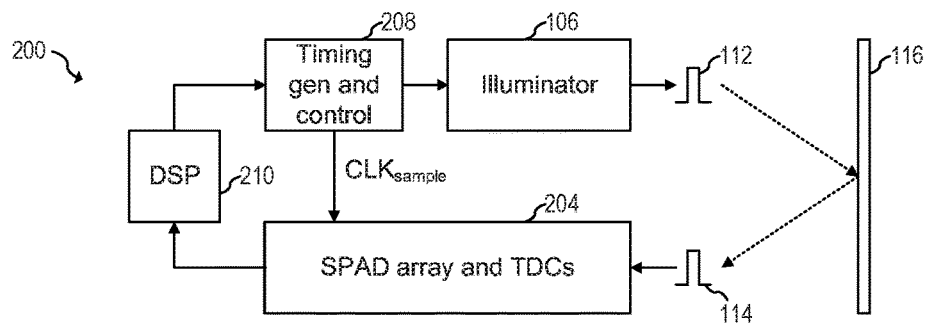
FIG. 2A shows a ToF imaging system, according to an embodiment of the present invention.

FIG. 2A shows ToF imaging system 200, according to an embodiment of the present invention. ToF imaging system 200 includes SPAD array 204, includes illumination source 106, SPAD array 204, timing generation and control circuit 208, and DSP 210.

During normal operation, illumination source 106 emits radiation pulse 112 at a time controlled by timing generation and control circuit 208. Radiation pulse 114 is reflected back from object 116 and is sense by SPAD array 204. SPAD array 204 generates a digital data representing the time between the emission of radiation pulse 112 and reception of radiation pulse 114 using a plurality of TDCs that are clocked with a gated clock ($CLK_{sample}$) provided by timing generation and control circuit 208. Clock $CLK_{sample}$ is routed using clock trees to balance the timing of the clock and is synchronized with a clock used for generating radiation pulses 112. DSP 210 may process the information data received by SPAD array 204 to determine the distance to object 116.

DSP 210 may be implemented in any way known in the art. For example, DSP 210 may be implemented with a general purpose DSP. Some embodiments may implement custom logic for some or all of the digital signal processing. For example, some embodiments may implement custom logic for histogram generation.

Illumination source 106 may be implemented in any way known in the art. For example, some embodiments may implement illumination source 106 with vertical cavity surface emitting laser (VCSEL). In some embodiments, a single VCSEL may be used. Other embodiments may use an array of VCSELs. Some embodiments may use a single edge-emitting LASER diode or an array of edge-emitting LASER diodes. Other implementations, such as implementations using laser emitting diodes (LEDs) or any other modulated light source are also possible.

Timing generation and control circuit 208 and SPAD array 204 may be implemented with any of the embodiments disclosed herein.

Figure 2B:
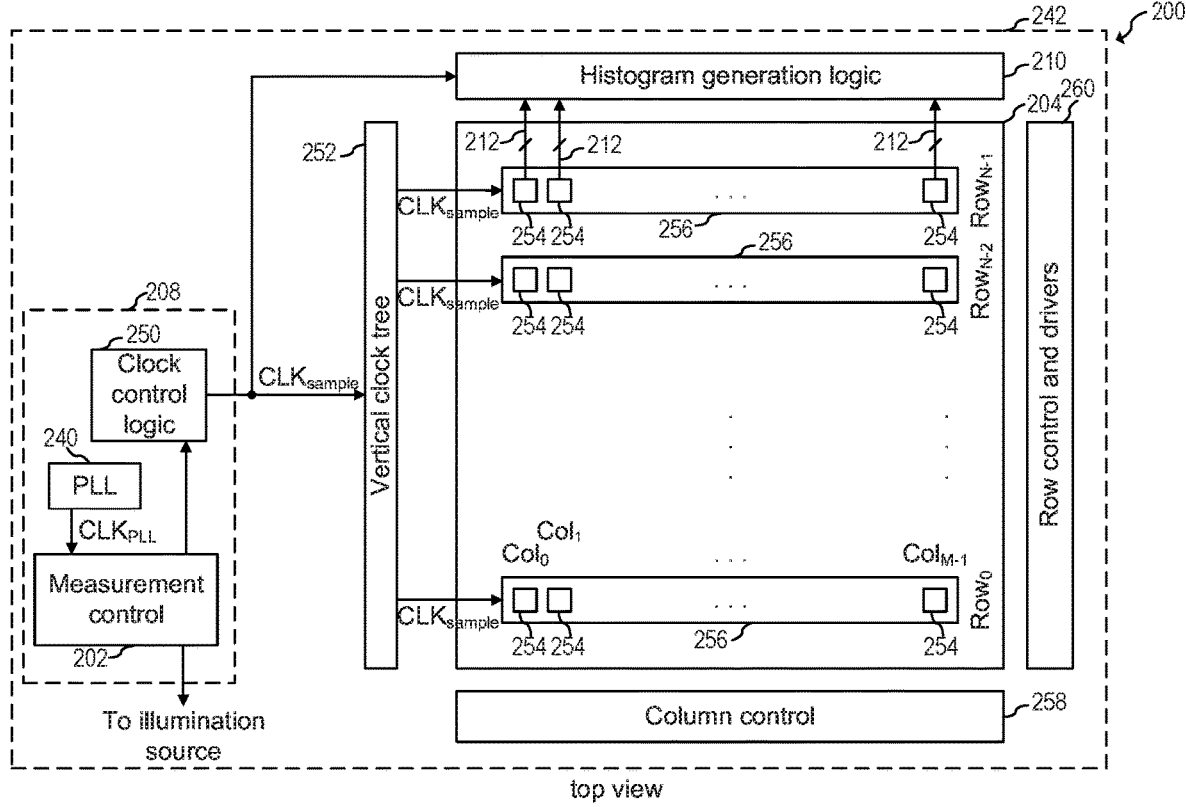
FIG. 2B shows a diagram illustrating a top view of a layout of portions of a ToF imaging system (not to scale) of FIG. 2A, as well as some of the electrical connections, according to an embodiment of the present invention.

FIG. 2B shows a diagram illustrating a top view of a layout of portions of ToF imaging system 200 (not to scale), as well as some of the electrical connections, according to an embodiment of the present invention. As shown in FIG. 2B, ToF imaging system 200 includes SPAD array 204, SPAD array column control circuit 258, SPAD array row control and drivers circuit 260, timing generation and control circuit 208, and vertical clock tree 252. Timing generation and control circuit 208 includes PLL 240, clock control logic circuit 250, and measurement control circuit 202. SPAD array 204 includes N rows 256. Each row 256 has M macro pixels 254. Each macro pixel includes one or more SPADs and a TDC. In some embodiments, a plurality of macro pixels may share a TDC.

During normal operation, PLL 240 generates clock $CLK_{PLL}$ and provides it to measurement control circuit 202. Measurement control circuit 202 generates system clock $CLK_{SYS}$ (not shown) based on clock $CLK_{PLL}$ for use in ToF imaging system 200. Measurement control circuit 202 also transmits a clock signal that is synchronized with the generation of radiation pulses 112 to clock control logic circuit 250. Clock logic circuit 250 generates gated clock $CLK_{sample}$ based on the clock received from measurement control circuit 202 and provides clock $CLK_{sample}$ to SPAD array 204 using clock trees (to balance clock timing). Clock $CLK_{sample}$ is gated (i.e., off) when SPAD array 204 is not used and is enabled (i.e., running) when SPAD array 204 is being used.

When SPAD array 204 is enabled, each TDC of SPAD array 204 generates a stream of digital outputs 212 (not all shown) based on whether the SPADs associated with the respective TDC have been stimulated by radiation pulse 112. Each digital output 212 has a plurality of bits (e.g., 2 bits, 4 bits, 8 bits, 12 bits, 16 bits, etc.) that are streamed at a frequency lower than the frequency of clock $CLK_{sample}$ (e.g., 8 times slower for 8 bits, 16 times slower for 16 bits, etc.). DSP 210 receives digital outputs 212 and generates one or more histograms based on the received digital outputs 212.

SPAD array 204 may occupy an area as small as 1 mm by 1 mm (1 $mm^2$) or smaller, or as big as 6 mm by 6 mm (36 $mm^2$) or bigger. The area occupied by SPAD array 204 does not have to be square (e.g., 2 mm by 3 mm). Other dimensions for SPAD array 204 are also possible. As a non-limiting example, when SPAD array 204 has a horizontal length of 6 mm and a vertical length of 4 mm, vertical clock tree 252 has a length of about 4 mm, SPAD array has 128 row 256 (N=90), where each row 256 has 120 macro pixels 254 (M=120). Each row 256 receives clock $CLK_{sample}$ and routes it using a horizontal clock tree (not shown) that has a length of about 6 mm. Digital outputs 212 generated from $row_0$ are routed with routing channels having a length of about 4 mm while routing channels for digital outputs 212 of other rows have a length shorter than 4 mm.

Vertical clock tree 252 and horizontal clock trees (not show) are used to balance the timing of clock $CLK_{sample}$ as it is routed through SPAD array 204. In other words, by balancing clock $CLK_{sample}$ using clock trees, the timing between reception of a radiation pulse 114 and clock $CLK_{sample}$ received by any of macro pixels 254 is matched. Vertical clock tree 252 and the horizontal clock trees (not shown) may be implemented in any way known in the art. In some embodiments, clock gating of clock $CLK_{sample}$ is performed per row. For example, in some embodiments, a single row is active at a time. In other words, only a single horizontal clock tree routes clock $CLK_{sample}$ while the other horizontal clock trees of the other rows are disabled. In some embodiments, each row is activated sequentially. For example, $Row_0$ is active first and captures ToF measurements, then $Row_0$ is disabled and $Row_1$ (not shown) is activated to capture ToF measurements, etc., until reaching $Row_{N-1}$. Other embodiments may perform ToF measurements in more than one row at a time, such as two rows at a time, or more, including all the rows at the same time.

In some embodiments, the routing channels associated with each digital output 212 may route, in addition to the data output of the respective TDC, the clock used by the TDC. Having the data generated by the TDC and the clock used by the TDC in the same routing channels has the advantage of minimizing any phase discrepancies between the data generated by the TDC and the clock used by the TDC that may be caused by the capacitance associated with the routing channels. DSP 210, therefore, can process the data received from digital outputs 212 without any timing instabilities.

Some embodiments may divide SPAD array 204 into different zones (e.g., 16 zones). The zones may be selectively enabled when used and selectively disabled when not used. In some embodiments, if a zone is disabled, clock $CLK_{sample}$ may be gated for the disabled zone while still available (i.e., not gated) for the enabled zones.

Portions of ToF imaging system 200, such as SPAD array 204, SPAD array column control circuit 258, SPAD array row control and drivers circuit 260, PLL 240, clock control logic circuit 250, vertical clock tree 252, and measurement control circuit 202 may be implemented in an integrated circuit having monolithic semiconductor substrate 242. Other portions of ToF imaging system 200 (not shown), such as circuitry for controlling the generation of radiation pulses may also be disposed in substrate 242. The specific layout locations of particular blocks shown in FIG. 2A are show as an example only. Other arrangements are possible.

In some embodiments, ToF imaging system 200 may be implemented in a multi-chip package have more than one semiconductor substrate. Other embodiments may implement one or more portions of ToF imaging system 200 with discrete components.

PLL 240 may be implemented in any way known in the art. PLL may generate the reference clock at frequencies such as 1 GHz, 2 GHz, 4 GHz or higher. Lower frequencies, such as 500 MHz or lower may also be used. In some embodiments, PLL 240 may be a fractional PLL configured to generate a clock with a frequency between 2 GHz and 4 GHz. Other frequencies may also be used.

Advantages of some embodiments include a reduction of power consumption of an imaging array by minimizing the length of the routing channels that are switched at high frequencies (e.g., routing channels between the SPADs and the TDCs, and any internal clocks generated by each TDC, if applicable) and by minimizing switching across routing channels of digital outputs 212, which may be long. The power consumption is further reduced by gating clock $CLK_{sample}$ when the imaging array is not being used. The reduction in power consumption is achieved while maintaining high resolution in ToF measurements. In some embodiments, power consumption is reduced by gating portions of the imaging array, such as by performing ToF measurements sequentially a single row at a time.

Figure 2C:
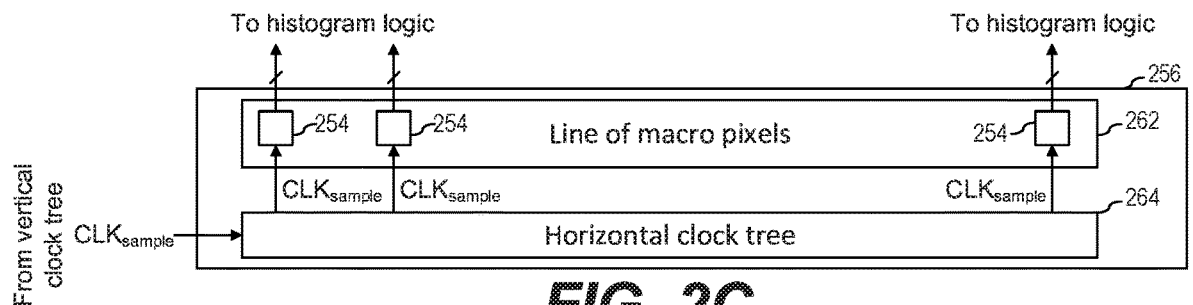
FIGS. 2C and 2D show details of a row and a macro pixel of the SPAD array of FIG. 2B, respectively, according to an embodiment of the present invention.
Figure 2D:
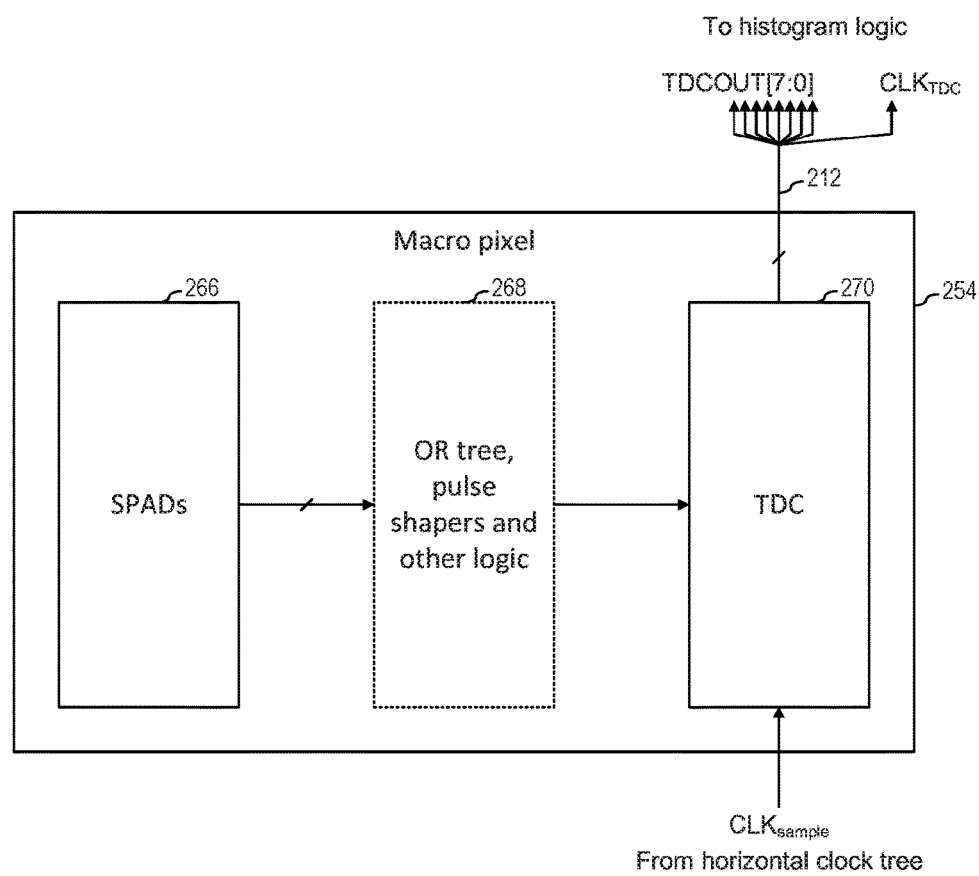

FIGS. 2C and 2D show details of row 256 and macro pixel 254, respectively, according to an embodiment of the present invention. As shown in FIGS. 2C and 2D, row 256 includes line of macro pixels 262 and horizontal clock tree 264. Line of macro pixels 262 includes a plurality of macro pixels 254. Macro pixel 254 includes SPAD circuit 266, OR tree 268 and TDC 270.

During normal operation, row 256 receives clock $CLK_{sample}$ from vertical clock tree and routes clock $CLK_{sample}$ using horizontal clock tree 264 to each of macro pixel 254. SPAD circuit 266 generates pulses based on reception of radiation pulses 114. OR tree 268 receives the pulses from SPAD circuit 266 and generates a pulse each time a pulse is receives from SPAD circuit 266. TDC 270 receives the pulses from OR tree 268 and generates data TDCOUT (e.g., 8 bits) corresponding to the time of reception of the pulses receives from OR tree 268. TDC 270 generates clock $CLK_{TDC}$ based on clock $CLK_{sample}$ and generates data TDCOUT each clock cycle of clock $CLK_{TDC}$. Clock $CLK_{TDC}$ has a lower frequency than clock $CLK_{sample}$ and is typically a divided version of the clock (e.g., division by 8) that may or may not have a phase difference with respect to clock $CLK_{sample}$. However, clock $CLK_{TDC}$ typically maintains the same phase relationship with respect to clock $CLK_{sample}$. After the initial sample of data is made within the TDC, data is managed synchronously with little or no risk of metastability.

As shown in FIGS. 2C and 2D, each macro pixel includes TDC 270. In some embodiments, TDC 270 may be shared with a plurality of SPAD circuits 266. For example, instead of each macro pixel having TDC 270, TDC 270 may be shared with one or more rows. For example, a first row may have a line of macro pixels with each having a TDC, and a second row disposed next to the first row may have a line of macro pixels where each macro pixel is implemented without TDC 270. The macro pixels of the second row may use the TDCs of the first row. Sharing of TDC 270 in other ways (e.g., sharing between one or more columns) is also possible.

SPAD circuit 266 includes a plurality of SPADs, such as 2, 4, 5, 6, 8, 16 or more. In some embodiments, SPAD circuit 266 includes a single SPAD.

OR tree 268 is an optional circuit that implements an OR function between the plurality of SPADs of SPAD circuit 266 and TDC 270. OR tree 268 may include pulse shapers (not shown), such as one shot circuits, to improve transmission of pulses to TDC 270. By using pulse shapers, which are monostable circuits that shorten a pulse by using a delay circuit, less pile up (i.e. merging) of pulses may be achieved, thereby increasing the number of pulses that can be detected and measured.

TDC 270 generates a plurality of outputs TDCOUT every clock cycle of clock $CLK_{TDC}$. In the example shown in FIG. 2D, TDCOUT has 8 bits. In some embodiments, TDCOUT may have more bits (e.g., 10 bits, 12 bits, or more), or less bits (e.g., 4 bits or less). Clock $CLK_{TDC}$ may be routed along with TDCOUT to DSP 210 to reduce the possibility of timing issues resulting from delays of routing TDCOUT (since clock $CLK_{TDC}$ would experience the same delay, and TDCOUT is references to $CLK_{TDC}$). In some embodiments, not all TDCs 270 route clock $CLK_{TDC}$ to DSP 210. For example, in some embodiments, only one TDC per zone routes clock $CLK_{TDC}$ to DSP210, where a zone includes a plurality of macro pixels 254 (e.g., 16 macro pixels). In other embodiments, none of the TDCs 270 route clock CLKTDC to DSP 210. Instead, clock TDC is generated by DSP210 based on the received clock $CLK_{sample}$ from clock control logic circuit 250.

Figure 2E:
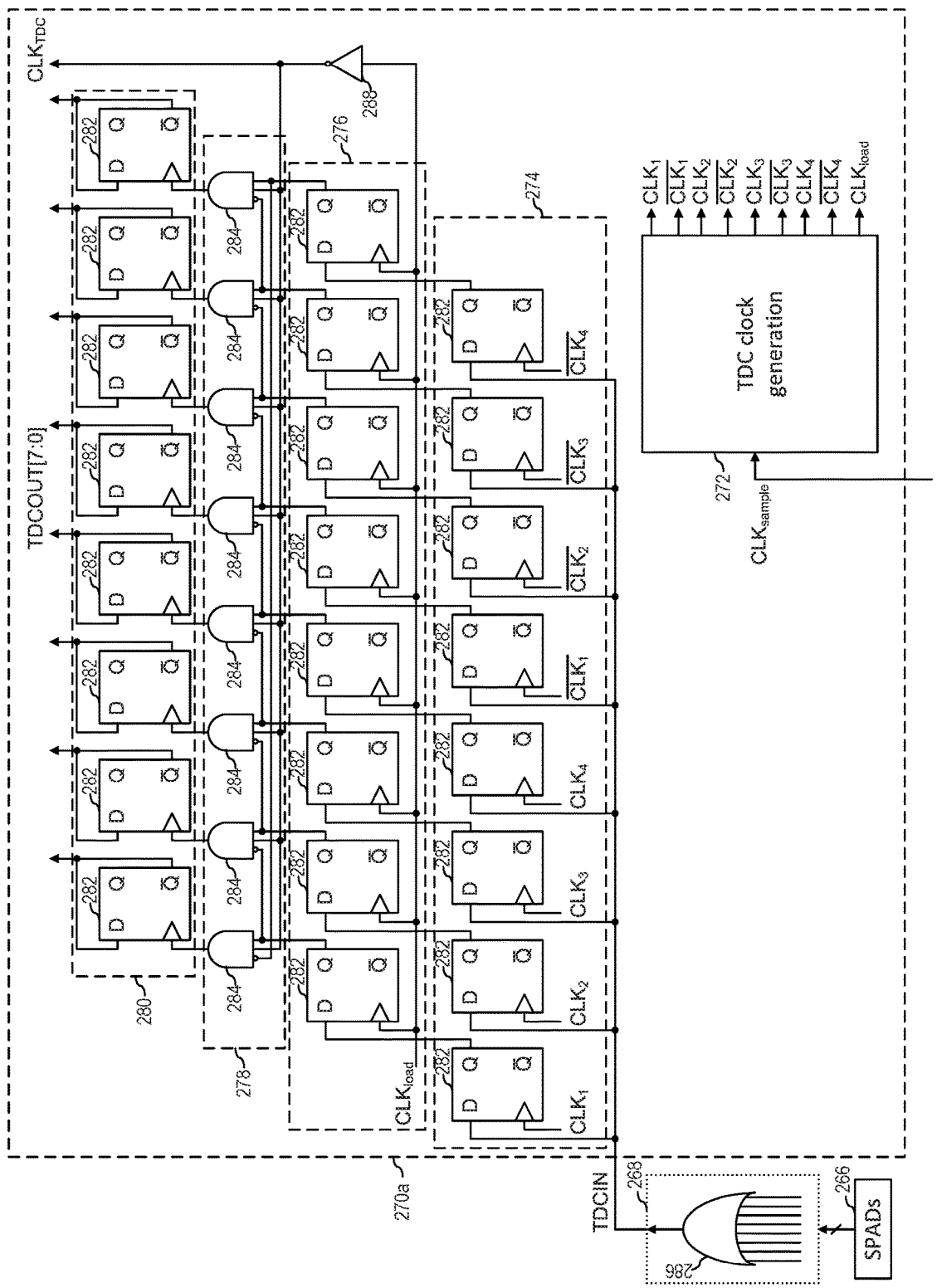
FIGS. 2E-2G shows a schematic, timing diagram and event diagram, respectively, of a possible implementation of the TDC of FIG. 2D, according to an embodiment of the present invention.
Figure 2F:
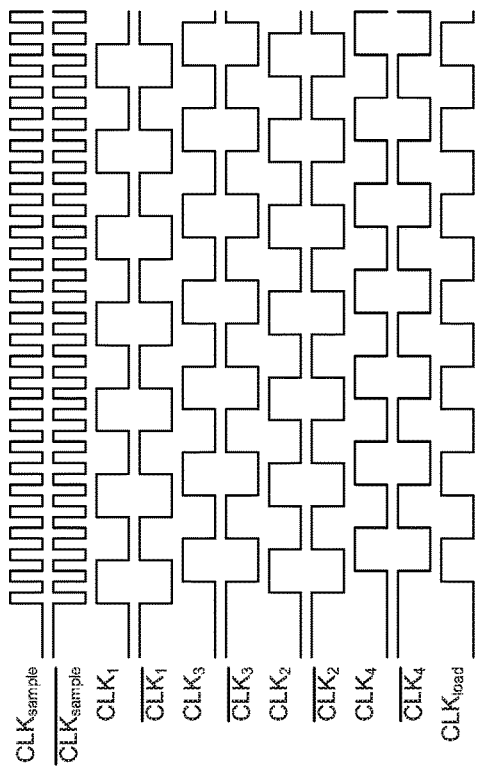
Figure 2G:
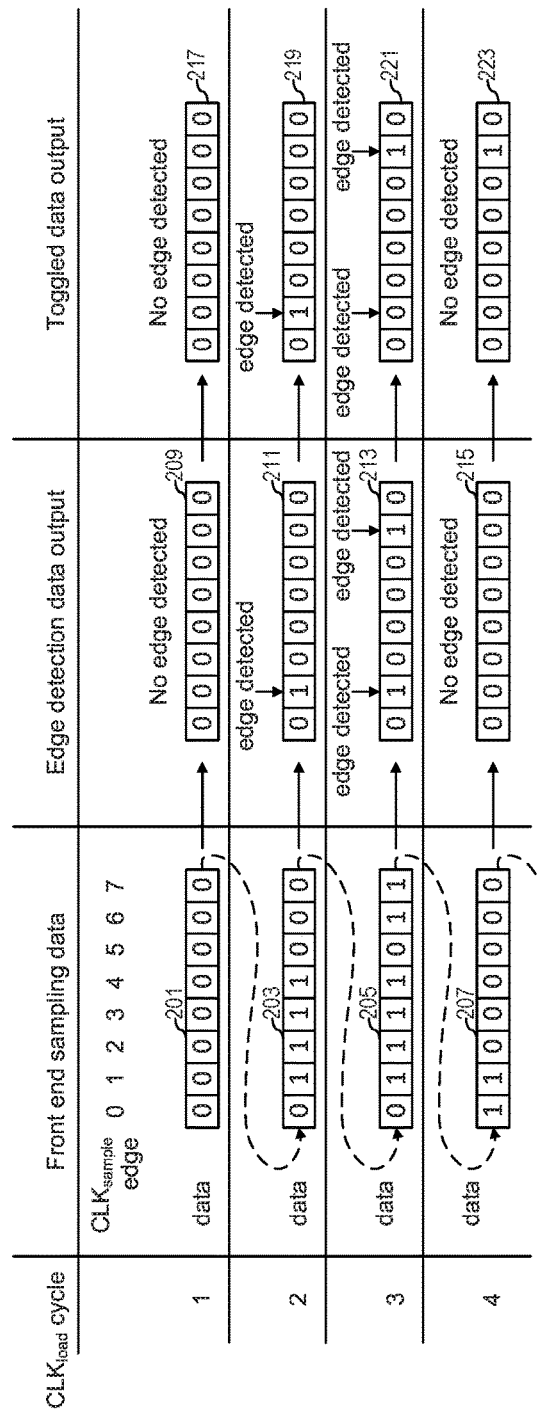

FIGS. 2E-2G show a schematic, timing diagram and event diagram, respectively, of a possible implementation of TDC 270, according to an embodiment of the present invention. FIG. 2E may be understood in view of FIGS. 2F and 2G. As shown in FIG. 2E, TDC 270a includes input terminal TDCIN, sampling circuit 274, clock alignment circuit 276, edge detection circuit 278, toggle circuit 280, output terminals TDCOUT, and TDC clock generation circuit 272.

During normal operation, clock generation circuit 272 receives clock $CLK_{sample}$ and generates a plurality of delayed clocks (clocks $CLK_1$, $CLK_2$, $CLK_3$, $CLK_4$, $\overline{CLK_1}$, $\overline{CLK_2}$, $\overline{CLK_3}$, $\overline{CLK_4}$) aligned with edges of clock $CLK_{sample}$, as shown in FIG. 2F. Clock alignment circuit 276 then samples the outputs of sampling circuit 274 every clock pulse of clock $CLK_{load}$. When a pulse is received in terminal TDCIN, it is sampled in each of the flip flops 282 of sampling circuit 274 according to the time that it was clocked. For example, if the pulse received at terminal TDCIN has a duration of 4 clock edges of clock $CLK_{sample}$ and is received a clock edge after clock $CLK_{load}$ toggled, the data contained in flip flops 282 of clock alignment circuit 276 is shown in data 203 of FIG. 2G.

Reception of a radiation pulse 114 occurs when TDCIN transitions from 0 to 1. Edge detection circuit 278 is used to detect when such transition occurs, while ignoring transitions from 1 to 0. For example, as shown in FIG. 2E, each of the AND gates have an input connected to the input of each of the two adjacent AND gates (i.e., the AND gate before it and the AND gate after it). An AND gate 284 will only output a 1 when clocked when it receives a 1 from its associated flip flop 282 of clock alignment circuit 276 and when the AND gate before it receives from its associated flip flop 282 of clock alignment circuit 276 a 0. Continuing with the previous example, when flip flops 282 contain data 203, edge detection circuit 278 generates outputs data as shown in data 211 of FIG. 2G.

Toggle circuit 280 receives data from edge detection circuit 278 and toggles each time an edge is detected. FIG. 2G illustrates an example of the operation of TDC 270. As shown in FIG. 2G, during the first cycle of clock $CLK_{load}$, no radiation pulse 114 is received. Therefore, the data stored in clock alignment circuit 276 has no 0 to 1 transition, as shown in data 201. As a result, no edge is detected by edge detection circuit 278 and toggle circuit 280 does not toggle, as shown in data 209 and 217, respectively.

During the second cycle of clock $CLK_{load}$, a radiation pulse 114 is received. Therefore, the data stored in clock alignment circuit 276 has a sequence of 1, as shown in data 203. Edge detection circuit 278 detects an edge corresponding to the time when the radiation pulse 114 was received, as shown in data 211. Toggle circuit 280 toggles the location corresponding to where the edge was detected, as shown in data 219.

During the third cycle of clock $CLK_{load}$, two radiation pulses 114 are received. Therefore, the data stored in clock alignment circuit 276 has a sequence of 1, as shown in data 205 and 207. Edge detection circuit 278 detects both pulses as edge corresponding to the time when the radiation pulses 114 were received, as shown in data 213. Toggle circuit 280 toggles the location corresponding to where the edges were detected, as shown in data 221.

During the fourth cycle of clock $CLK_{load}$, no radiation pulse 114 is received. Therefore, the data stored in clock alignment circuit 276 has no 0 to 1 transition, as shown in data 207. As a result, no edge is detected by edge detection circuit 278 and toggle circuit 280 does not toggle, as shown in data 215 and 223, respectively.

As shown in FIGS. 2E-2G, switching over routing channels 212, which may have a significant associated capacitance, is reduced by switching at a rate lower than the rate of clock $CLK_{sample}$. Switching is further reduced by only switching when edges are detected. The switching is further reduced (divided by 2) by using toggle circuit 280. Since the associated capacitance of routing channels associated with digital output 212 may be significant, the power consumption reduction, therefore, may be also significant.

As shown in FIGS. 2E and 2F, TDC 270a generates an 8 bit output (TDCOUT) and TDC clock generation circuit 272 generates 8 multi-phase clocks. Some embodiments may generate more than 8 multi-phase clocks or less than 8 multi-phase clocks and a TDCOUT may have more than 8 bits or less than 8 bits. As another non-limiting example, an embodiment may include a TDC clock generation circuit that generates 3 multi-phase clocks and a TDC that generates a 3 bit output. By generating the multi-phase clocks locally (e.g., inside the macro pixel), the length of the routing channels of the multi-phase clocks is small. As a result, differences in phases may be minimized or avoided.

TDC 270a may be implemented in other ways. For example, even though it may increase power consumption, some embodiments may avoid implementing toggle circuit 280 and edge detection circuit 278 to, for example, save area. Other modifications, such as using different logic components for implementing edge detection circuit 278, different flip flop types instead of d flip flops, etc., are also possible.

As can be seen from FIGS. 2E-2G, the frequency of clock $CLK_{sample}$ is not constraint by a custom digital logic implementation. In other words, TDC 271a operates properly regardless of delays present in the system, as long as the delays are short enough to allow for proper operation. Additionally, the signals at output TDCOUT are generated with a constant phase relationship with respect to clock $CLK_{TDC}$. Therefore, standard digital logic may be used to implement TDC 271a and to process the signals generated by TDC 271a.

Figure 2H:
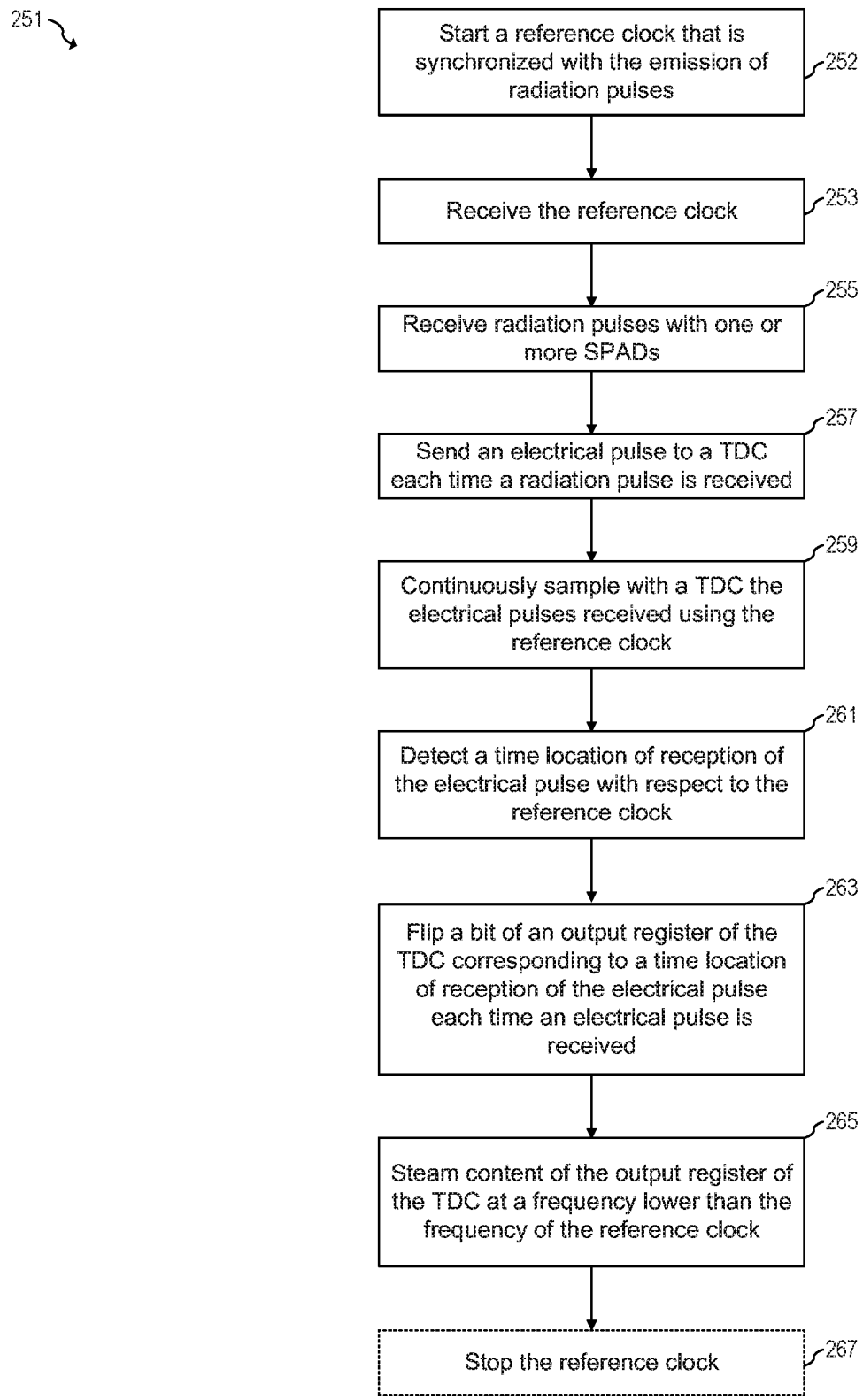
FIG. 2H illustrates a flow chart of an embodiment method of operating a TDC, according to an embodiment of the present invention.

FIG. 2H illustrates a flow chart of embodiment method 251 of operating a TDC, according to an embodiment of the present invention. Method 251 may be implemented in TDC 270a. Alternatively, method 251 may be implemented with other circuit architectures, such as, for example, TDCs implemented with shift registers. The discussion that follows assumes that a TDC as shown in FIG. 2E implements method 251 of operating a TDC.

During step 252, a reference clock (e.g., clock $CLK_{sample}$) that is synchronized with the emission of radiation pulses (e.g., radiation pulses 112) is started. In some embodiments, the reference clock is also synchronized with a system clock (e.g., clock $CLK_{SYS}$). The synchronization may be accomplished by a clock control logic circuit (e.g., clock control logic circuit 250a).

During step 253, the reference clock is received by a TDC (e.g., TDC 270a).

One or more SPADs (e.g., from SPAD circuit 266) receive radiation pulses (e.g., radiation pulses 114) during step 255. Each time the one or more SPADs receive a radiation pulse, the SPADs transmit an electrical pulse to the TDC. Some embodiments may use combination logic to determine when the pulse to the TDC is transmitted. For example, in some embodiments, an OR tree circuit (e.g., OR tree 286) may perform an OR function between the output of the one or more SPADs and the input of the TDC. Other embodiments may use an AND tree, where a pulse is sent to the TDC when the ANDed SPADs (e.g., two SPADs) are triggered. An XOR tree may also be implemented, where a toggled pulse indicates a photon. Other logic functions that combine SPAD pulses may be implemented.

The TDC continuously samples the electrical pulses received from the one or more SPADs during step 259. The sampling rate of the TDC is based on the reference clock. In some embodiments, the sampling rate may be equal to the frequency of the reference clock, which may be running at a frequency above 1 GHz, (e.g., 2 GHz). In other embodiments, the sampling rate may be lower than the frequency of the reference clock.

During step 261, a time location of the reception of an electrical pulse with respect to the reference clock is detected. The detection of the time location may be performed by an edge detector (e.g., edge detector 278). Multiple edges may be detected per emission of a radiation pulse.

During step 263, the bits of an output register (e.g., flip flops of toggle circuit 280) that correspond to the time location of reception of the electrical pulse are toggled (i.e., flipped) each time the edge detector detects an edge.

The content of the output register of the TDC is streamed to an external circuit (e.g., DSP 210) for further processing at a rate lower than the frequency of the reference clock (e.g., at 500 MHz) during step 265. A TDC clock (e.g., clock $CLK_{TDC}$) may be generated and routed together with the streaming of the content of the output register. The TDC clock maintains the same phase relationship with respect to the signals transmitting the content of the output register.

During step 267, the reference clock may be gated (i.e., not switching) by the clock control logic circuit when the TDC is not in use.

Each output of the stream of outputs generated by the TDC may be referred to as a time stamp since it provides time information with respect to a reference clock. By avoiding the need of resetting the TDC (e.g., resetting the flip flops of the TDC) each time the TDC generates an output (e.g., a time stamp), the capture of multiple electrical pulses per radiation pulse emission by continuously sampling the received electrical pulses and continuously streaming of the output is possible.

Figure 2I:
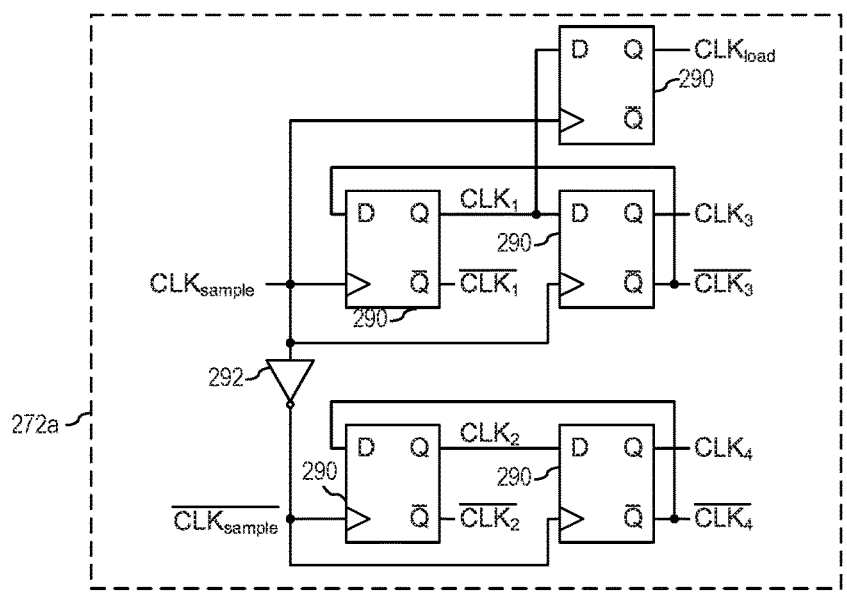
FIG. 2I shows a schematic of a possible implementation of the clock generation circuit of FIG. 2E, according to an embodiment of the present invention.

FIG. 2I shows a schematic of a possible implementation of clock generation circuit 272, according to an embodiment of the present invention. The waveforms of clock generation circuit 272a are shown in FIG. 2F. As shown in FIGS. 2F and 2I, clocks are generated with different phases, where each of the clocks is aligned with an edge (rising or falling) of clock $CLK_{sample}$. Generating the clocks in this manner allows for the generation of 8 clocks with different phases in only 4 clock cycles of clock $CLK_{sample}$. For example, if clock $CLK_{sample}$ runs at a frequency of 2 GHz each of the 8 generated clocks (clocks $CLK_1$, $CLK_2$, $CLK_3$, $CLK_4$, $\overline{CLK_1}$, $\overline{CLK_2}$, $\overline{CLK_3}$, $\overline{CLK_4}$) run at 500 MHz and with different phases. This embodiment has the advantage of clock generating the 8 clocks at 500 MHz without having to run clock CLKsample at 4 GHz, thereby reducing power consumption.

Some embodiments may generate clocks $CLK_1$, $CLK_2$, $CLK_3$, $CLK_4$, $\overline{CLK_1}$, $\overline{CLK_2}$, $\overline{CLK_3}$, $\overline{CLK_4}$ only on transitions in one direction (e.g., rising edge). In such embodiments, clock $CLK_{sample}$ runs at 4 GHz while each of the 8 generated clocks (clocks $CLK_1$, $CLK_2$, $CLK_3$, $CLK_4$, $\overline{CLK_1}$, $\overline{CLK_2}$, $\overline{CLK_3}$, $\overline{CLK_4}$) run at 500 MHz. Such embodiment may increase accuracy since rising times and falling times may be different in clock $CLK_{sample}$. Other implementations of clock generation circuit 272 are also possible.

Figure 2J:
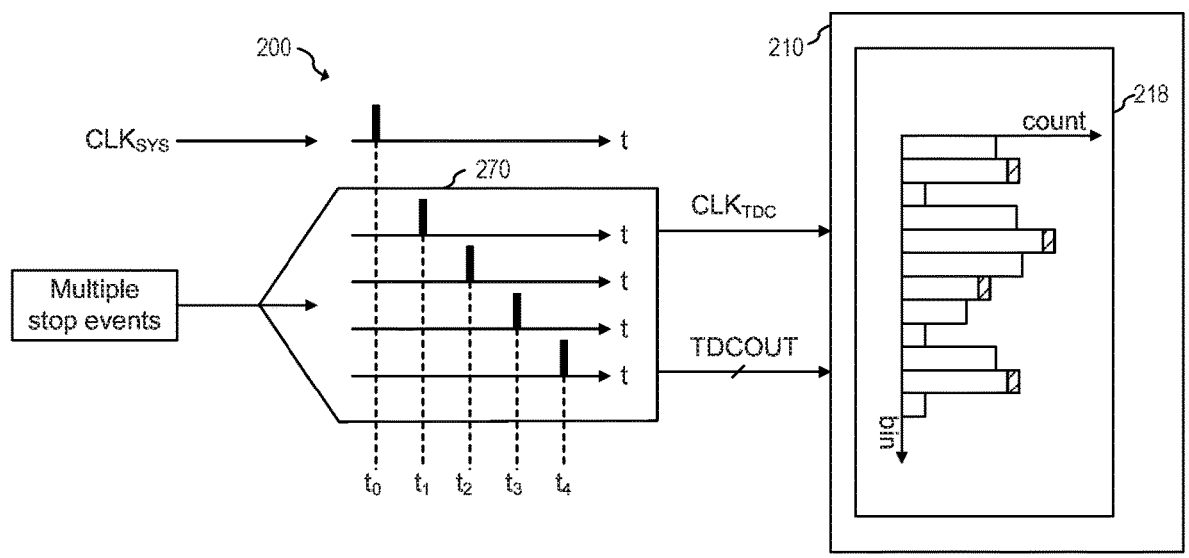
FIG. 2J shows a diagram illustrating a process of histogram creation based on a ToF measurements of the ToF imaging system of FIG. 2A, according to an embodiment of the present invention.

As shown in FIG. 2G, by using TDC 270a with clock $CLK_{sample}$, multiple events may be captured per emission of radiation pulse 112. For example, if radiation pulse 112 is being generated with a frequency of 500 MHz, multiple edges may be captured between emissions of radiation pulse 112. FIG. 2J shows a diagram illustrating a process of histogram creation based on ToF measurements of ToF imaging system 200, according to an embodiment of the present invention. During normal operation, illumination source 106 emits a radiation pulse 112 each clock cycle of clock $CLK_{SYS}$. SPAD array 204 may receive multiple radiation pulses each clock cycle of clock $CLK_{SYS}$. Each TDC 270 sends a stream of TDCOUT data to DSP 210, where each TDCOUT data may contain multiple edges. DSP 210 updates histogram 218 by using an accumulator (not shown) and incrementing by +1 the bin (or bins) in the histogram associated with the one or more edges contained in the TDCOUT data. Since TDC 270 provides all timing bins (TDCOUT) referenced to a single reference clock (CLK-TDC), routing between the macro pixels and the histogram generation logic (e.g., DSP 210) is simplified.

Figure 2K:
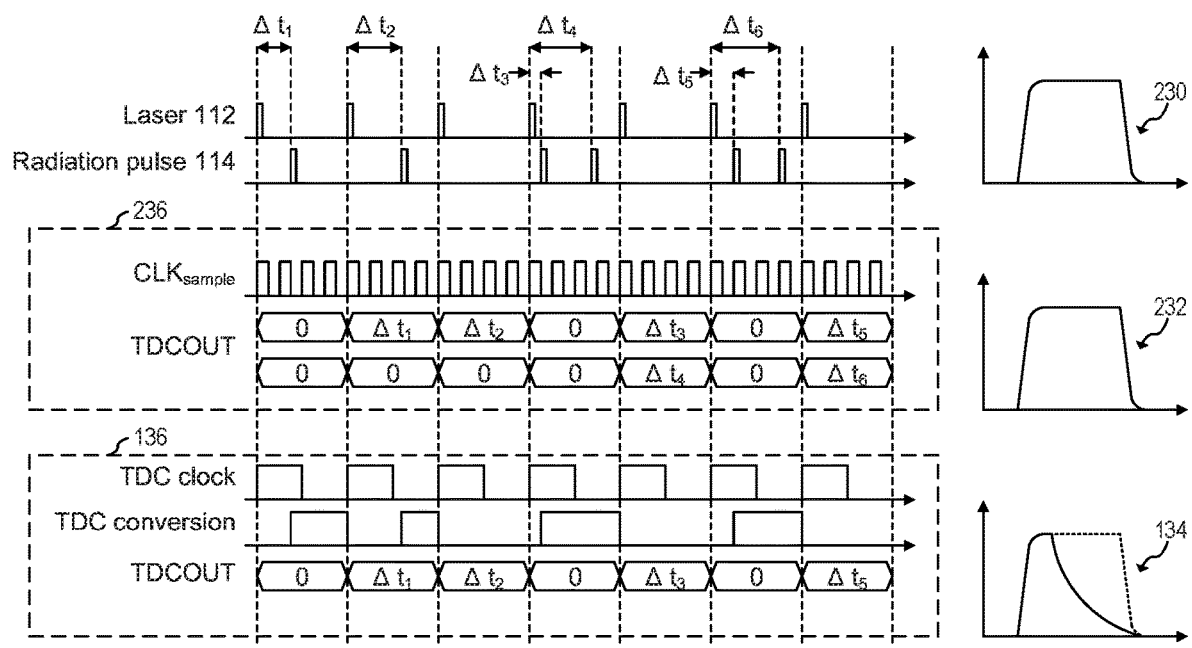
FIG. 2K shows a comparison between an ideal histogram of radiation pulses received, a histogram of radiation pulses processed with the TDC of FIG. 2D, and a histogram of radiation pulses processed with the TDC of FIG. 1B.

FIG. 2K shows a comparison between an ideal histogram of radiation pulses received, a histogram of radiation pulses processed with TDC 270, and a histogram of radiation pulses processed with TDC 102. As shown in FIG. 2K, histogram 230 is an ideal histogram of radiation pulses 114, histogram 232 is the histogram of radiation pulses 114 processed with TDC 270 (e.g., TDC 270a), and histogram 134 is the histogram of radiation pulses 114 processed with TDC 102a. As shown by waveforms 236, TDCOUT is capable of capturing multiple events per radiation pulse 112. As a result, histogram 232 is very similar or identical to histogram 230. As shown by waveform 136, missing one or more events may result in histogram 134, which exhibits pile-up distortion.

For clarity purposes, only two captured events per radiation pulse 114 are shown in waveform 236 of FIG. 2K. However, a TDC, such as TDC 270, may capture one event per clock period or clock edge of clock $CLK_{sample}$. And, typically, there are multiple clock periods/edges of clock $CLK_{sample}$ between radiation pulses 114. The number of bits in the data output TDCOUT may be scaled appropriately. For example, TDC 270a may capture 8 events per radiation pulse 114, and may have a TDCOUT with 8 bits. As another non-limiting example, in a LIDAR application, there may be 3,600 clock pulses per laser pulse. In such embodiment, 3,600 events may be captured between laser pulses. Some embodiments may capture more than 3,600 events per clock period. Other embodiments may capture less than 3,600 events per clock period. Some embodiments that implement an edge detection circuit may detect events after 2 cycles of clock $CLK_{sample}$ since a 0 may be required before a 1 in order to detect a transition.

Figure 2L:
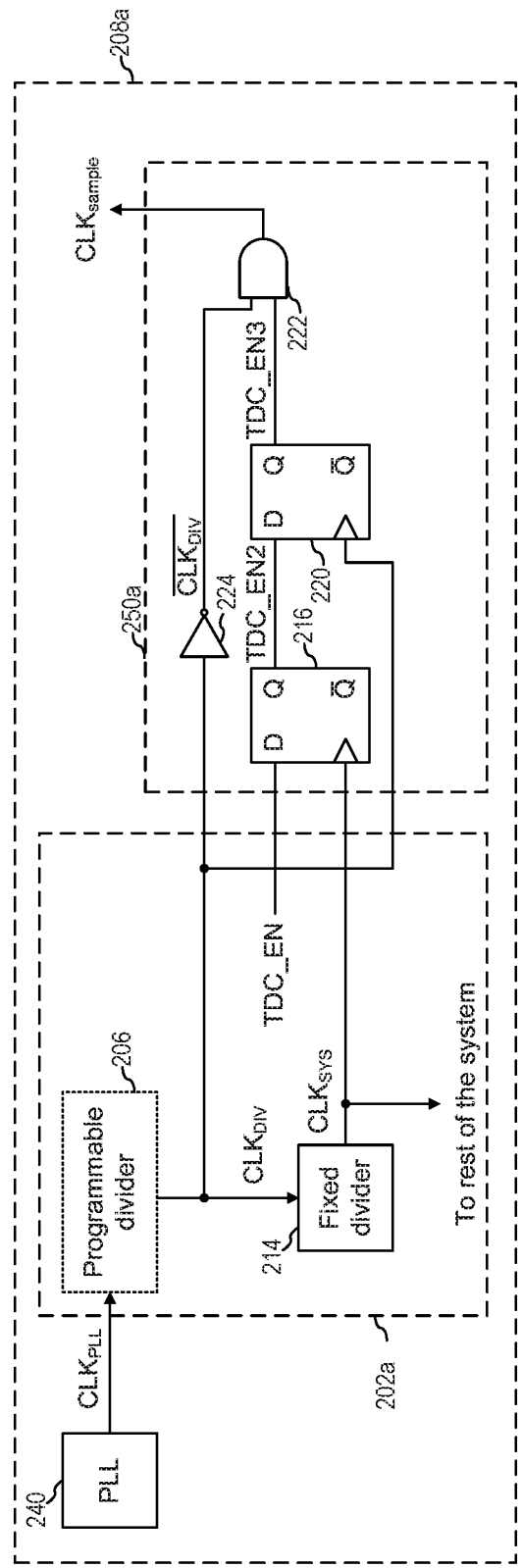
FIG. 2L shows a schematic diagram of a possible implementation of the timing generation and control circuit of FIG. 2A, according to an embodiment of the present invention.
Figure 2M:
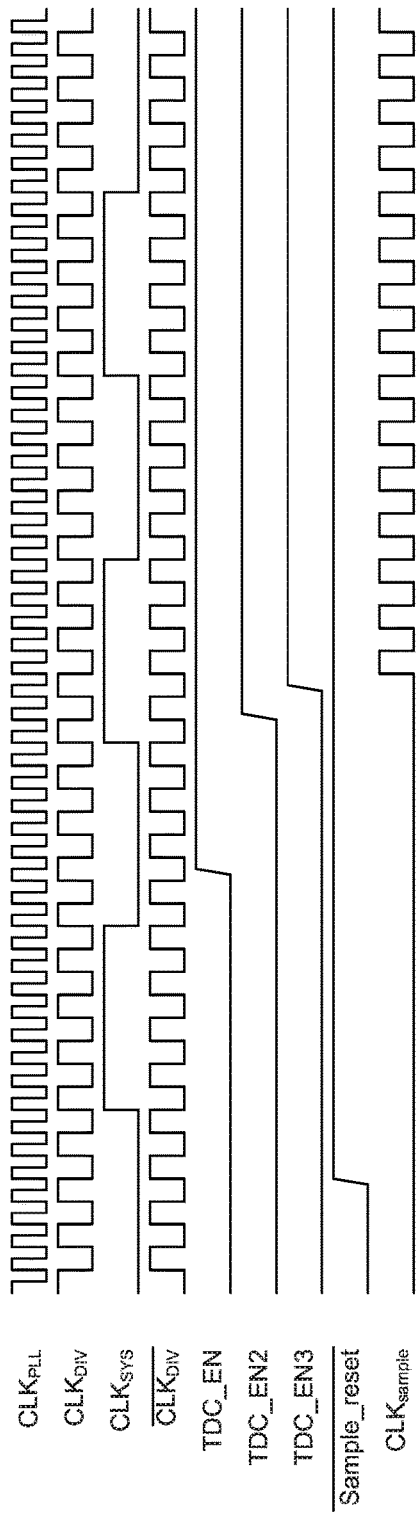
FIGS. 2M and 2O show waveform diagrams associated with a possible implementation of the start of shot timing and end of shot timing, respectively, of the timing generation and control circuit of FIG. 2L, according to an embodiment of the present invention.
Figure 2O:
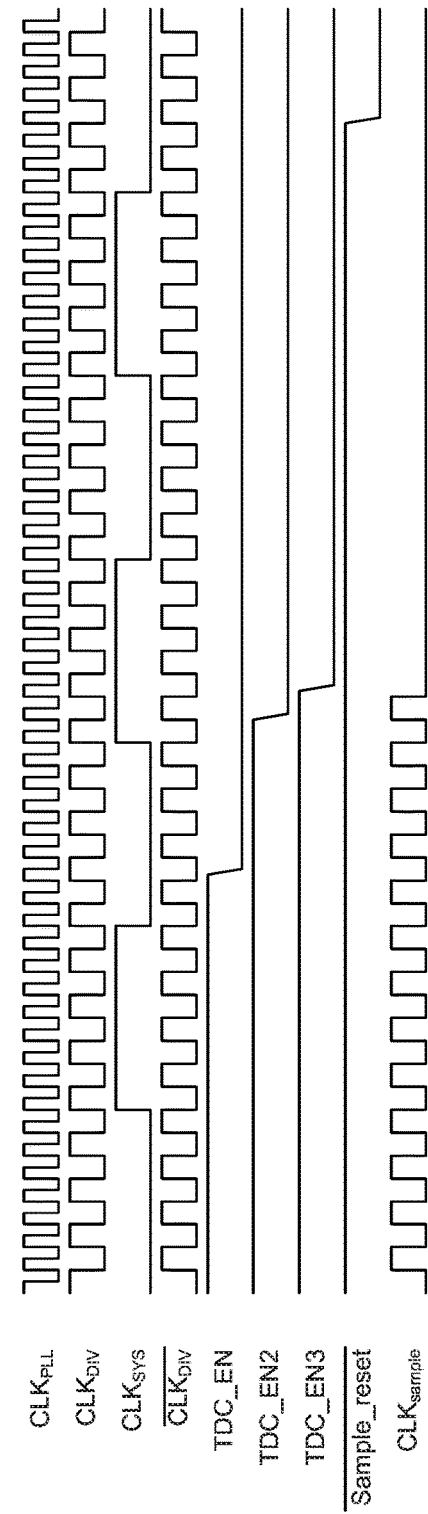

FIG. 2L shows a schematic diagram of timing generation and control circuit 208a, which is a possible implementation of timing generation and control circuit 208, according to an embodiment of the present invention. FIGS. 2M and 2O show waveform diagrams associated with a possible implementation of the start of shot timing and end of shot timing, respectively, of timing generation and control circuit 208a, according to an embodiment of the present invention. FIG. 2L may be understood in view of FIGS. 2M and 2O.

As shown in FIG. 2L, timing generation and control circuit 208a includes PLL 240, measurement control circuit 202a and clock control logic circuit 250a. Measurement control circuit 202a includes programmable divider circuit 206 and fixed divider circuit 214. Clock control logic circuit 250a includes inverter 224, AND gate 222, and flip flops 216 and 220.

During normal operation, PLL 240 generates clock $CLK_{PLL}$. Programmable divider circuit 206 generates clock $CLK_{DIV}$ as a divided version of clock $CLK_{PLL}$ and provides clock $CLK_{DIV}$ to fixed divider circuit 214 and clock control logic circuit 250a. Fixed divider circuit 214 generates clock $CLK_{SYS}$ by dividing clock $CLK_{DIV}$ by a fixed integer number (e.g., 2, 4, 8, etc.). Clock CLKSYS is provided to circuitry of ToF imaging system 200, such as to synchronize emission of radiation pulses 112.

When SPAD array 204 is disabled, signal TDC_EN is not asserted and clock $CLK_{sample}$ is not switching (i.e. clock $CLK_{sample}$ is gated). SPAD array 204 is enabled when signal TDC_EN is asserted, marking the start of shot time. SPAD array 204, or a portion of SPAD array 204, may be enabled for multiple emissions of radiation pulses 112 (i.e., a burst of radiation pulses 112). After the burst of radiation pulses 112, SPAD array 204 may be disabled by deasserting signal TDC_EN and thereby gating clock $CLK_{sample}$. Some embodiments may gate clock $CLK_{sample}$ after each burst of radiation pulses 112. Other embodiments may gate clock $CLK_{sample}$ after each emission of radiation pulse 112. Yet other embodiments may keep clock $CLK_{sample}$ running for multiple bursts of radiation pulses 112, such as for example, for a full frame of data or more. In some embodiments, $CLK_{sample}$ is kept running for multiple bursts of radiation pulses 112 while keeping the same spatial selection in SPAD array 204. In other embodiments, $CLK_{sample}$ is kept running for multiple bursts of radiation pulses 112 while different spatial selections in SPAD array 204 capture ToF measurements (e.g., a different spatial selection per bust of radiation pulses 112).

As a non-limiting example, in some embodiments, a portion of SPAD array 204 (which corresponds to a first spatial location) is enabled and clock $CLK_{sample}$ is ungated before emission of a first burst of radiation pulses 112. After emission of the first burst of radiation pulses 112, clock $CLK_{sample}$ is gated. Then, a different portion of SPAD array 204 is enabled and a second burst of radiation pulses 112 is emitted. In some embodiments, the portion of SPAD array 204 selected may be a sub-array of SPAD array 204 having a plurality of rows and columns. In other embodiments, the portion of SPAD array 204 may be a single row or column of SPAD array 204. Other implementations are also possible.

To avoid meta-stability in clock $CLK_{sample}$, which is an inverted version of clock CLKDIV, clock $CLK_{sample}$ is gated by signal TDC_EN3, which is itself gated by signal TDC_EN2, which is itself gated by signal TDC_EN. Such mechanism keeps clock $CLK_{sample}$ synchronized and with a locked phase with respect to clock $CLK_{SYS}$, which is also used for synchronizing emissions of radiation pulses 112.

Programmable divider 206 is an optional block that may be programmed to generate clock $CLK_{DIV}$ by dividing clock $CLK_{PLL}$ by a selectable integer number, such as 2, 4, 8, etc. Some embodiments may provide clock $CLK_{PLL}$ directly to fixed divider circuit 214.

It is understood that the generation of clock $CLK_{sample}$ may be gated using other components and techniques. Meta-stability of clock $CLK_{sample}$ may be avoided in other ways, such as by using a different clock that is synchronized with clock $CLK_{PLL}$, using a different type flip flop (other than D flip flops), etc.

FIG. 2M shows waveforms that illustrate the process from assertion of signal TDC_EN to the un-gating of clock $CLK_{sample}$. Signal $\overline{Sample\_reset}$ is used to reset flip flops 216 and 220 (when 0). In some embodiments, signal $\overline{Sample\_reset}$ may also be used to reset other flip flops of ToF imaging system 200, such as flip flops 282 and 290. Some embodiments may invert the polarity of some or all of the signals illustrate without affecting functionality. The associated circuits may be modified to accommodate for such change in polarity.

TDC_EN signal is generated by measurement control circuit 202a. In some embodiments, signal TDC_EN may be generated by an external start signal. As shown in FIG. 2M, clock $CLK_{sample}$ is ungated 4 clock cycles (of clock $CLK_{DIV}$) after signal TDC_EN is asserted. A different number of clock cycles in between the assertion of signal TDC_EN and the ungating of clock $CLK_{sample}$ may be used. For example, in some embodiments, a delay of 2 to 6 clock cycles of clock $CLK_{DIV}$ between the assertion of signal TDC_EN and the ungating of clock $CLK_{sample}$ may be used.

FIG. 2O shows waveforms that illustrate the process from deassertion of signal TDC_EN to the gating of clock $CLK_{sample}$. As shown in FIG. 2O, clock $CLK_{sample}$ is gated 4 clock cycles (of clock $CLK_{DIV}$) after signal TDC_EN is deasserted. A different number of clock cycles in between the deassertion of signal TDC_EN and the gating of clock $CLK_{sample}$ may be used. For example, in some embodiments, a delay of 2 to 6 clock cycles of clock $CLK_{DIV}$ between the deassertion of signal TDC_EN and the gating of clock $CLK_{sample}$ may be used.

Advantages of some embodiments include that by generating clock $CLK_{sample}$ based clock $CLK_{SYS}$ (or a clock synchronized with clock $CLK_{SYS}$), the timing of the TDCs of SPAD array 204 is synchronized with the emissions of pulses. A single clock, therefore, is sufficient for providing timing to SPAD array 204 and the TDCs of SPAD array 204. By routing a single clock to SPAD array 204, complexity of the system is reduced. Routing a single clock avoids the need of balancing the phases of multi-phase clocks routed along routing channels that may be long. Avoiding the routing of multi-phase clocks over long routing channels also reduces power consumption. By gating clock $CLK_{sample}$ when SPAD array 204 is not being used, power consumption is further reduced.

Since only a single reference clock ($CLK_{sample}$) is distributed to all TDCs 270, some embodiments implement all TDCs 270 outside SPAD array 204 instead of inside the macro pixels of SPAD array 204. For example, the TDCs 270 may be grouped together and disposed in a location adjacent to SPAD array 204. By grouping all TDCs 270 together, a better fill factor (e.g., less area) may be obtained.

Regardless of whether the TDCs are interspersed in the imaging array, or whether the TDCs are grouped together and disposed in a location adjacent to the imaging array, routing a single clock, instead of a plurality of clocks, over a distance (e.g., of 1 mm or more) eases matching constrains.

When implementing circuits that are sensitive to timing, such as TDC 270, timing delays are, in some cases, not negligible. For example, as shown in FIG. 2I, the clock generation may exhibit, in addition to the clock to Q delay (the delay between the edge of clock $CLK_{sample}$ and the time in which output Q of flip flop 290 transitions) delays associated with inverters, such as inverter 292. An inverter delay may be, for example, between 10 ps and 30 ps. Compensation for such delays may be advantageous to avoid timing violations.

Figure 3:
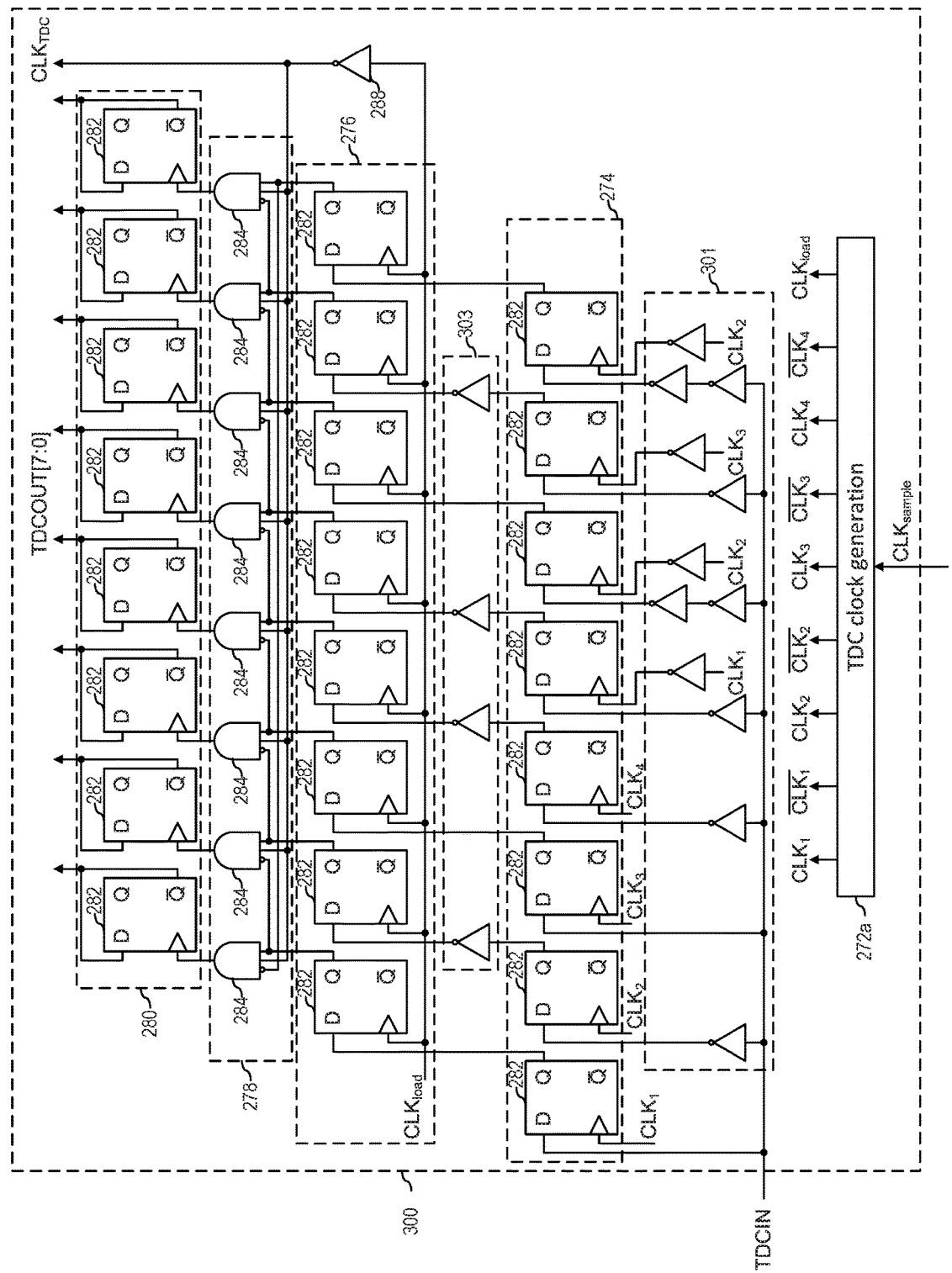
FIG. 3 shows a schematic of a possible implementation of the TDC of FIG. 2D that implements possible timing compensation, according to an embodiment of the present invention.

FIG. 3 shows a schematic of a possible implementation of TDC 270 that implements possible timing compensation, according to an embodiment of the present invention. TDC 300 operates in a similar manner than TDC 270a. TDC 300, however, implements delay equalization circuit 301 to compensate for delays associated with TDC clock generation circuit 272. Since delay equalization circuit 301 flips some of the bits, polarity correction circuit 303 is used to flip back the flipped bits. In this way delay compensation is achieved without affecting the operation of the TDC. In some embodiments, delay equalization and/or polarity corrections are optional. A person skilled in the art would recognize that other portions of the embodiments disclosed herein may benefit from delay equalization and/or polarity correction, and may modify the circuits appropriately.

Figure 4:
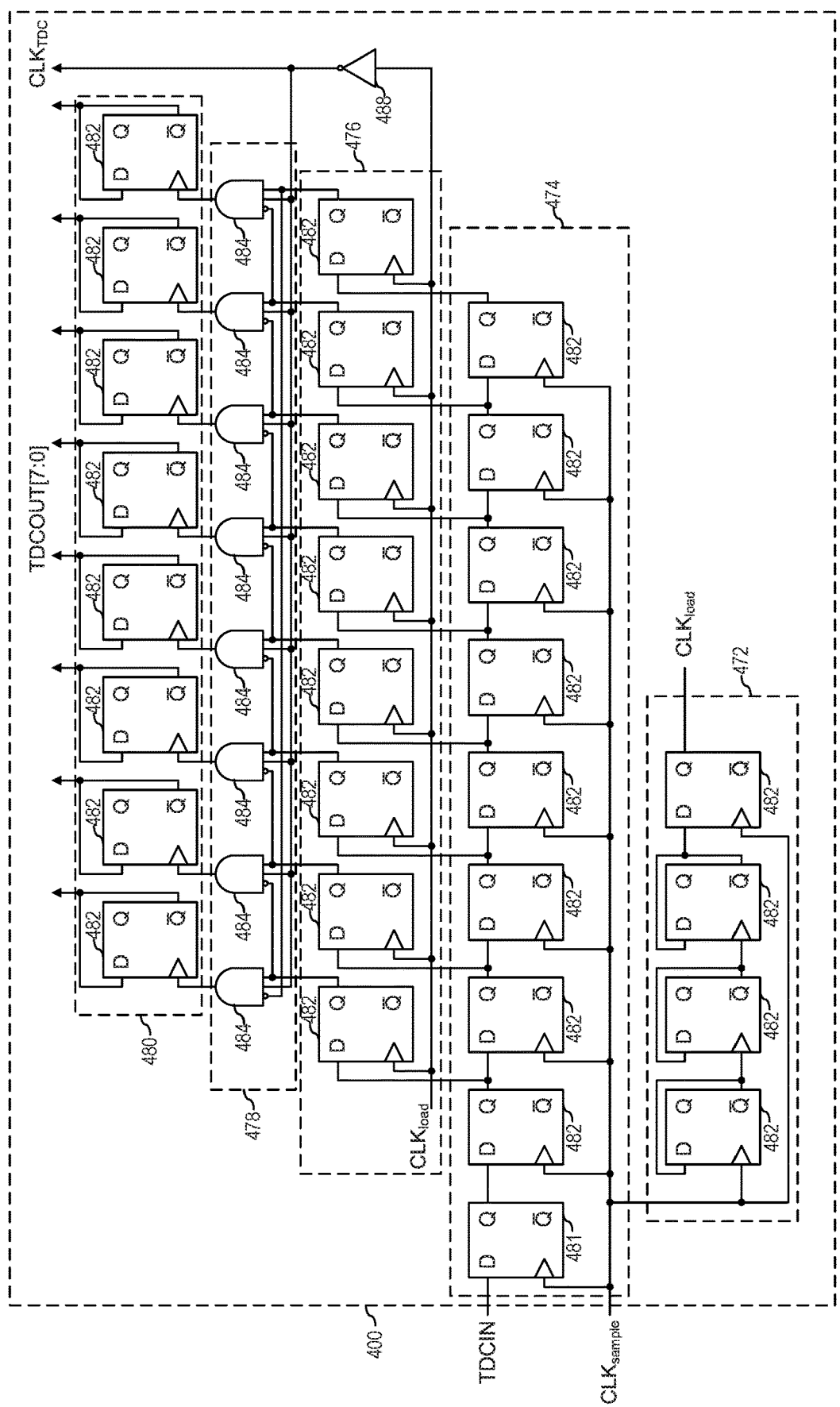
FIG. 4 shows a schematic of another possible implementation of the TDC of FIG. 2D, according to an embodiment of the present invention.

FIG. 4 shows a schematic of another possible implementation of TDC 270, according to an embodiment of the present invention. TDC 400 includes input terminal TDCIN, sampling circuit 474, clock alignment circuit 476, edge detection circuit 478, toggle circuit 480, output terminals TDCOUT, and TDC clock generation circuit 472.

TDC 400 operates in a similar manner than TDC 270a. TDC 400, however, implements sampling circuit 474 with a shift register, as shown in FIG. 4. As a result, the generation of a multi-phase clock is avoided. Since transistors 481 and 482 of sampling circuit 474 are clocked on the rising edge of clock $CLK_{sample}$, when clock CLKsample is running at, e.g., 4 GHz, clocks $CLK_{load}$ and CLKTDC run at 500 MHz.

Flip flop 481 may be added to TDC 400 for sample and meta-stability protection. Since clock $CLK_{sample}$ runs continuously when not gated, flip flop 481 does not interfere with the operation of the shift register of sampling circuit 474.

One general aspect includes a time to digital converter (TDC) including: a clock input configured to receive a reference clock that is synchronized with a first event, the reference clock having a first frequency; a clock generation circuit configured to generate a first clock at a first output of the clock generation circuit based on the reference clock, the first clock having a second frequency lower than the first frequency; a data input configured to receive an input stream of pulses, where the input stream of pulses is based on the first event; a sampling circuit having an input register, the sampling circuit coupled to the data input, the sampling circuit configured to continuously sample the input stream of pulses into the input register based on the reference clock; and output terminals configured to stream time stamps based on the input stream of pulses at the second frequency, where the stream of time stamps is synchronized with the first clock.

Implementations may include one or more of the following features. The TDC where the data input is directly connected to each bit of the input register. The TDC where the output terminals include eight terminals to carry eight bits or three terminals to carry three bits. The TDC further including an output clock terminal coupled to the first output of the clock generation circuit via an inverter. The TDC where the first event corresponds to emission of a radiation pulse. The TDC where the data input is coupled to an output of a single photon avalanche diode (SPAD). The TDC where the data input is coupled to an output of an OR tree. The TDC where the second frequency is equal to the first frequency divided by 4 or to the first frequency divided by 8. The TDC further including: an edge detection circuit having inputs coupled to corresponding outputs of the sampling circuit, and outputs, where each output of the edge detection circuit corresponds to an input of the inputs of the edge detection circuit, the edge detection circuit configured to detect transitions of the input stream of pulses from a first state to a second state, and generate, at the corresponding output of the edge detection circuit, a pulse each time a transition from the first state to the second state is detected at the corresponding input of the edge detection circuit; and a toggle circuit including inputs coupled to corresponding outputs of the edge detection circuit, and an output register coupled to the output terminals, where each bit of the output register is coupled to a corresponding input of the toggle circuit, the toggle circuit configured to toggle a corresponding bit of the output register each time the edge detection circuit generates a pulse at the corresponding output of the edge detection circuit. The TDC where the sampling circuit includes an alignment register configured to be clocked with the first clock, and where the input register is configured to be clocked with the reference clock. TDC where the clock generation circuit is configured to generate a plurality of clocks, where each of the plurality of clocks is configured to be aligned with a different edge of the reference clock, where the input register is configured to be clocked based on the plurality of clocks, and where the sampling circuit further includes an equalization circuit coupled between the clock generation circuit and the input register, the equalization circuit configured to compensate for delays associated with generating the plurality of clocks; and a polarity correction circuit coupled between the input register and the alignment register, the polarity correction circuit including one or more inverters. The TDC where each of the input register and the alignment register includes a plurality of d flip flops. The TDC where the clock generation circuit is configured to generate a plurality of clocks, where each of the plurality of clocks is configured to be aligned with a different edge of the reference clock, and where the input register is clocked with the plurality of clocks. The TDC where the input register includes a shift register. The TDC where the clock input is directly connected to each bit of the input register. The TDC where the input stream of pulses is synchronized with the reference clock. A system including the TDC and a timing generation and control circuit including: a phased locked loop (PLL) configured to generate a first clock at an output of the PLL; a measurement control circuit having an input coupled to the output of the PLL, the measurement control circuit configured to generate a divided clock at a first output of the measurement control circuit, generate a system clock at a second output of the measurement control circuit, and generate a TDC enable signal at a third output of the measurement control circuit; and a clock control logic circuit having an output coupled to the output of the timing generation and control circuit, where the clock control logic circuit generates the reference clock at the output of the timing generation and control circuit based on the first output, second output, and third output of the measurement control circuit, where the clock input of the TDC is coupled to an output of the timing generation and control circuit. The system where the measurement control circuit includes: a programmable divider circuit having an input coupled to the output of the PLL and configured to generate at an output of the programmable divider the divided clock; and a fixed divider circuit having an input coupled to the output of the programmable divider circuit and configured to generate at an output of the fixed divider circuit the system clock. The system where the TDC is disposed inside a macro pixel of a SPAD array including a plurality of macro pixels arranged in rows and columns, and where the PLL is disposed outside the SPAD array.

Another general aspect includes a method including: generating a phased locked loop (PLL) clock; generating a divided clock based on the PLL clock; generating a system clock based on the divided clock; receiving an enable signal; generating a reference clock based on the divided clock, the system clock and the enable signal, where the reference clock is synchronized with a first event, and where the reference clock has a first frequency; receiving a stream of pulses at a data input; continuously sampling the data input based on the reference clock; detecting a time location of a transition from a first state of the data input to a second state of the data input; and generating a stream of digital words based on the time location of the detected transitions, where the digital words are streamed at a second frequency lower than the first frequency.

Implementations may include one or more of the following features. The method where the first frequency is over 1 GHz and the second frequency is under 500 MHz. The method where the second frequency is equal to the first frequency divided by 4 or to the first frequency divided by 8. The method where the PLL clock has a third frequency, the divided clock has a fourth frequency and the system clock has a fifth frequency, where the fourth frequency is equal to the third frequency divided by 2, divided by 4 or divided by 8, where the fifth frequency is equal to the fourth frequency divided by 8, and where the first frequency is equal the fourth frequency. The method where the first event includes emitting radiation pulses, and the stream of pulses is based on reception of radiation pulses, the method further including performing time-of-light (ToF) measurements based on the generated stream of digital words. The method further including routing the reference clock over a single photon avalanche diode (SPAD) array including a plurality of macro pixels arranged in rows a columns using a vertical clock tree and a plurality of horizontal clock trees, where generating the PLL clock includes generating the PLL clock outside the SPAD array, and where receiving the stream of pulses at the data input includes receiving the stream of pulses at a first macro pixel of the plurality of macro pixels. The method further including sequentially performing ToF measurements a single row of the SPAD array at a time. The method further including gating the reference clock by deasserting the enable signal.

Yet general aspect includes a single photon avalanche diode (SPAD) array including a plurality of macro pixels disposed over a substrate and arranged in rows and columns, where each macro pixel includes a SPAD circuit having one or more SPADs, where a given row of the rows of the SPAD array includes a horizontal clock tree configured to receive a reference clock that is synchronized with emissions of radiation pulses from a vertical clock tree, where a given macro pixel of the given row includes a given time to digital converter (TDC) and a given SPAD circuit coupled to the given TDC, the given SPAD circuit including one or more SPADs, where given outputs of the given TDC are routed in a vertical direction towards an edge of the SPAD array.

The SPAD array where a second given macro pixel of the given row includes a second given SPAD circuit coupled to the given TDC. The SPAD array where a third given macro pixel of a second given row of the rows of the SPAD array includes a third given SPAD circuit coupled to the given TDC. The SPAD array where the given outputs of the given TDC includes given data outputs and a given clock output, where the given data outputs are configured to stream data at a rate based on a given frequency of the given clock output, the given frequency being smaller than a reference frequency of the reference clock. The SPAD array where the given TDC includes: a clock input configured to receive the reference clock a clock generation circuit configured to generate a given clock at a first output of the clock generation circuit based on the reference clock, the given clock having a given frequency lower than a reference frequency of the reference clock; a data input coupled to the given SPAD circuit and configured to receive an input stream of pulses; and a sampling circuit having an input register, the sampling circuit coupled to the data input, the sampling circuit configured to continuously sample the input stream of pulses into the input register based on the reference clock, where the given outputs are configured to stream time stamps based on the input stream of pulses at the given frequency. The SPAD array where the vertical clock tree receives the reference clock from a timing generation and control circuit disposed in the substrate and outside the SPAD array, the timing generation and control circuit including: a phased locked loop (PLL) configured to generate a PLL clock at an output of the PLL; a measurement control circuit having an input coupled to the output of the PLL, the measurement control circuit configured to generate a divided clock at a first output of the measurement control circuit, generate a system clock at a second output of the measurement control circuit, and generate a TDC enable signal at a third output of the measurement control circuit; and a clock control logic circuit having an output coupled to the output of the timing generation and control circuit, where the clock control logic circuit generates the reference clock at the output of the timing generation and control circuit based on the first output, second output, and third output of the measurement control circuit.

Another general aspect includes an imaging system including: a timing generation and control circuit disposed in a monolithic semiconductor substrate and having an output and configured to generate, at the output of the timing generation and control circuit, a reference clock that is synchronized with emissions of radiation pulses; a single photon avalanche diode (SPAD) array disposed in the monolithic semiconductor substrate and including a plurality of macro pixels arranged in rows and columns, where each macro pixel includes a respective SPAD circuit having one or more SPADs and a respective time to digital converter (TDC) coupled to the respective SPAD circuit, where each row of the SPAD array includes a respective horizontal clock tree configured to receive the reference clock from a vertical clock tree, where respective outputs of each TDC of the plurality of macro pixels are routed in a vertical direction to a first edge of the SPAD array; the vertical clock tree disposed over the monolithic semiconductor substrate and coupled to the output of the timing generation and control circuit and further coupled to each horizontal clock tree of the SPAD array; and a histogram generation logic circuit disposed in the monolithic semiconductor substrate and adjacent to the first edge of the SPAD array, the histogram generation logic circuit configured to receive outputs of each TDC of the plurality of macro pixels, where the timing generation and control circuit is disposed outside the SPAD array.

Implementations may include one or more of the following features. The imaging system where each TDC of the plurality of macro pixels includes: a clock input coupled to the respective horizontal tree; a clock generation circuit configured to generate a first clock at a first output of the clock generation circuit based on the reference clock, the first clock having a second frequency lower than a reference frequency of the reference clock; a data input coupled to a respective SPAD circuit of a respective macro pixel of a respective row of the rows of the SPAD array, the data input configured to receive an input stream of pulses from the respective SPAD circuit; a sampling circuit having an input register, the sampling circuit coupled to the data input, the sampling circuit configured to continuously sample the input stream of pulses into the input register based on the reference clock; and output terminals coupled to the histogram generation logic circuit and configured to stream time stamps based on the input stream of pulses at the second frequency.

Features of the embodiments presented may be combined in various ways.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A time to digital converter (TDC) comprising:
   a clock input configured to receive a reference clock that is synchronized with a first event, the reference clock having a first frequency;
   a clock generation circuit configured to generate a first clock at a first output of the clock generation circuit based on the reference clock, the first clock having a second frequency lower than the first frequency;
   a data input configured to receive an input stream of pulses, wherein the input stream of pulses is based on the first event;
   a sampling circuit having an input register, the sampling circuit coupled to the data input, the sampling circuit configured to continuously sample the input stream of pulses into the input register based on the reference clock; and
   output terminals configured to stream time stamps based on the input stream of pulses at the second frequency, wherein the stream of time stamps is synchronized with the first clock.

2. The TDC of claim 1, wherein the data input is directly connected to each bit of the input register.

3. The TDC of claim 1, wherein the output terminals comprise eight terminals to carry eight bits or three terminals to carry three bits.

4. The TDC of claim 1, further comprising an output clock terminal coupled to the first output of the clock generation circuit via an inverter.

5. The TDC of claim 1, wherein the first event corresponds to emission of a radiation pulse.

6. The TDC of claim 1, wherein the data input is coupled to an output of a single photon avalanche diode (SPAD).

7. The TDC of claim 1, wherein the data input is coupled to an output of an OR tree.

8. The TDC of claim 1, wherein the second frequency is equal to the first frequency divided by 4 or to the first frequency divided by 8.

9. The TDC of claim 1, further comprising:
   an edge detection circuit having inputs coupled to corresponding outputs of the sampling circuit, and outputs, wherein each output of the edge detection circuit corresponds to an input of the inputs of the edge detection circuit, the edge detection circuit configured to
      detect transitions of the input stream of pulses from a first state to a second state, and
      generate, at the corresponding output of the edge detection circuit, a pulse each time a transition from the first state to the second state is detected at the corresponding input of the edge detection circuit; and
   a toggle circuit comprising inputs coupled to corresponding outputs of the edge detection circuit, and an output register coupled to the output terminals, wherein each bit of the output register is coupled to a corresponding input of the toggle circuit, the toggle circuit configured to toggle a corresponding bit of the output register each time the edge detection circuit generates a pulse at the corresponding output of the edge detection circuit.

10. The TDC of claim 1, wherein the sampling circuit comprises an alignment register configured to be clocked with the first clock, and wherein the input register is configured to be clocked with the reference clock.

11. The TDC of claim 10, wherein the clock generation circuit is configured to generate a plurality of clocks, wherein each of the plurality of clocks is configured to be aligned with a different edge of the reference clock, wherein the input register is configured to be clocked based on the plurality of clocks, and wherein the sampling circuit further comprises
   an equalization circuit coupled between the clock generation circuit and the input register, the equalization circuit configured to compensate for delays associated with generating the plurality of clocks; and
   a polarity correction circuit coupled between the input register and the alignment register, the polarity correction circuit comprising one or more inverters.

12. The TDC of claim 10, wherein each of the input register and the alignment register comprises a plurality of D flip flops.

13. The TDC of claim 1, wherein the clock generation circuit is configured to generate a plurality of clocks, wherein each of the plurality of clocks is configured to be aligned with a different edge of the reference clock, and wherein the input register is clocked with the plurality of clocks.

14. The TDC of claim 1, wherein the input register comprises a shift register.

15. The TDC of claim 1, wherein the clock input is directly connected to each bit of the input register.

16. The TDC of claim 1, wherein the input stream of pulses is synchronized with the reference clock.

17. A system comprising the TDC of claim 1, and a timing generation and control circuit comprising:
   a phased locked loop (PLL) configured to generate a PLL clock at an output of the PLL;
   a measurement control circuit having an input coupled to the output of the PLL, the measurement control circuit configured to
      generate a divided clock at a first output of the measurement control circuit, generate a system clock at a second output of the measurement control circuit, and
generate a TDC enable signal at a third output of the measurement control circuit; and
a clock control logic circuit having an output coupled to the output of the timing generation and control circuit, wherein the clock control logic circuit generates the reference clock at the output of the timing generation and control circuit based on the first output, second output, and third output of the measurement control circuit, wherein the clock input of the TDC is coupled to an output of the timing generation and control circuit.

18. The system of claim 17, wherein the measurement control circuit comprises:
a programmable divider circuit having an input coupled to the output of the PLL and configured to generate at an output of the programmable divider circuit the divided clock; and
a fixed divider circuit having an input coupled to the output of the programmable divider circuit and configured to generate at an output of the fixed divider circuit the system clock.

19. The system of claim 17, wherein the TDC is disposed inside a macro pixel of a SPAD array comprising a plurality of macro pixels arranged in rows and columns, and wherein the PLL is disposed outside the SPAD array.

20. The TDC of claim 1, wherein the clock generation circuit is configured to generate a plurality of clocks, wherein each of the plurality of clocks is configured to be aligned with a different edge of the reference clock, and wherein the input register is clocked with the plurality of clocks.

21. A method comprising:
generating a phased locked loop (PLL) clock;
generating a divided clock based on the PLL clock;
generating a system clock based on the divided clock;
receiving an enable signal;
generating a reference clock based on the divided clock, the system clock and the enable signal, wherein the reference clock is synchronized with a first event, and wherein the reference clock has a first frequency;
receiving a stream of pulses at a data input;
continuously sampling the data input based on the reference clock;
detecting a time location of a transition from a first state of the data input to a second state of the data input; and
generating a stream of digital words based on the time location of the detected transitions, wherein the digital words are streamed at a second frequency lower than the first frequency.

22. The method of claim 21, wherein the first frequency is over 1 GHz and the second frequency is under 500 MHz.

23. The method of claim 21, wherein the second frequency is equal to the first frequency divided by 4 or to the first frequency divided by 8.

24. The method of claim 21, wherein the PLL clock has a third frequency, the divided clock has a fourth frequency and the system clock has a fifth frequency, wherein the fourth frequency is equal to the third frequency divided by 2, divided by 4 or divided by 8, wherein the fifth frequency is equal to the fourth frequency divided by 8, and wherein the first frequency is equal to the fourth frequency.

25. The method of claim 24, wherein the first event comprises emitting radiation pulses, and the stream of pulses is based on reception of the emitted radiation pulses, the method further comprising performing time-of-light (ToF) measurements based on the generated stream of digital words.

26. The method of claim 25, further comprising routing the reference clock over a single photon avalanche diode (SPAD) array comprising a plurality of macro pixels arranged in rows a columns using a vertical clock tree and a plurality of horizontal clock trees, wherein generating the PLL clock comprises generating the PLL clock outside the SPAD array, and wherein receiving the stream of pulses at the data input comprises receiving the stream of pulses at the data at a first macro pixel of the plurality of macro pixels.

27. The method of claim 26, further comprising sequentially performing ToF measurements a single row of the SPAD array at a time.

28. The method of claim 21, further comprising gating the reference clock by deasserting the enable signal.

29. A time to digital converter (TDC) comprising:
a clock input configured to receive a reference clock that is synchronized with a first emission of a radiation pulse, the reference clock having a first frequency;
a clock generation circuit configured to generate a first clock at a first output of the clock generation circuit based on the reference clock, the first clock having a second frequency lower than the first frequency;
a data input configured to receive an input stream of pulses from an output of an OR tree, wherein the input stream of pulses is based on the first emission of the radiation pulse;
a sampling circuit having an input register, the sampling circuit coupled to the data input, the sampling circuit configured to continuously sample the input stream of pulses into the input register based on the reference clock; and
output terminals configured to stream time stamps based on the input stream of pulses at the second frequency, wherein the stream of time stamps is synchronized with the first clock.

30. The TDC of claim 29, wherein the clock generation circuit is configured to generate a plurality of clocks, wherein each of the plurality of clocks is configured to be aligned with a different edge of the reference clock, and wherein the input register is clocked with the plurality of clocks.

31. The TDC of claim 29, wherein the sampling circuit comprises an alignment register configured to be clocked with the first clock, and wherein the input register is configured to be clocked with the reference clock.

32. A system comprising:
A time to digital converter (TDC) comprising:
a clock input configured to receive a reference clock that is synchronized with a first emission of a radiation pulse, the reference clock having a first frequency,
a clock generation circuit configured to generate a first clock at a first output of the clock generation circuit based on the reference clock, the first clock having a second frequency lower than the first frequency,
a data input configured to receive an input stream of pulses from an output of an OR tree, wherein the input stream of pulses is based on the first emission of the radiation pulse,
a sampling circuit having an input register, the sampling circuit coupled to the data input, the sampling circuit configured to continuously sample the input stream of pulses into the input register based on the reference clock, and output terminals configured to stream time stamps based on the input stream of pulses at the second frequency, wherein the stream of time stamps is synchronized with the first clock;

a phased locked loop (PLL) configured to generate a PLL clock at an output of the PLL;

a measurement control circuit having an input coupled to the output of the PLL, the measurement control circuit configured to:

generate a divided clock at a first output of the measurement control circuit, generate a system clock at a second output of the measurement control circuit, and generate a TDC enable signal at a third output of the measurement control circuit; and a clock control logic circuit having an output coupled to the output of a timing generation and control circuit, wherein the clock control logic circuit generates the reference clock at the output of the timing generation and control circuit based on the first output, second output, and third output of the measurement control circuit, wherein the clock input of the TDC is coupled to an output of the timing generation and control circuit.

33. The system of claim 32, further comprising a vertical cavity surface emitting laser (VCSEL) configured to generate the first emission of the radiation pulse.

34. The system of claim 32, further comprising a processor coupled to the TDC and configured to generate an histogram based on the output terminals of the TDC.

35. The system of claim 32, wherein the measurement control circuit comprises:

a programmable divider circuit having an input coupled to the output of the PLL and configured to generate, at an output of the programmable divider circuit, the divided clock; and a fixed divider circuit having an input coupled to the output of the programmable divider circuit and configured to generate at an output of the fixed divider circuit the system clock.

\* \* \* \* \*

UNITED STATES PATENT AND TRADEMARK OFFICE
CERTIFICATE OF CORRECTION

PATENT NO. : 10,715,754 B2
APPLICATION NO. : 15/877551
DATED : July 14, 2020
INVENTOR(S) : John Kevin Moore et al.

Page 1 of 1

It is certified that error appears in the above-identified patent and that said Letters Patent is hereby corrected as shown below:

In the Claims

In Column 22, Lines 10-12, Claim 26, delete "and wherein receiving the stream of pulses at the data input comprises receiving the stream of pulses at the data at a first macro pixel of the plurality of macro pixels" and insert --and wherein receiving the stream of pulses at the data input comprises receiving the stream of pulses at a first macro pixel of the plurality of macro pixels--.

Signed and Sealed this
Thirteenth Day of October, 2020

Andrei Iancu
*Director of the United States Patent and Trademark Office*